(12) United States Patent
Lee et al.

(10) Patent No.: US 12,718,761 B2
(45) Date of Patent: Aug. 25, 2026

(54) ELECTRONIC DEVICE

(71) Applicant: Samsung Display Co., LTD., Yongin-si (KR)

(72) Inventors: Sungeun Lee, Yongin-si (KR); Ki Nyeng Kang, Yongin-si (KR); Chanju Park, Yongin-si (KR); Keunkyu Song, Yongin-si (KR); Bekhyun Lim, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 19/271,085

(22) Filed: Jul. 16, 2025

(65) Prior Publication Data

US 2026/0155098 A1 Jun. 4, 2026

(30) Foreign Application Priority Data

Nov. 29, 2024 (KR) ........................ 10-2024-0174685

(51) Int. Cl.
*G09G 3/3233* (2016.01)
*H03K 17/56* (2006.01)

(52) U.S. Cl.
CPC ........... *G09G 3/3233* (2013.01); *H03K 17/56* (2013.01); *G09G 2300/0426* (2013.01); *G09G 2300/0819* (2013.01); *G09G 2300/0852* (2013.01); *G09G 2300/0861* (2013.01); *G09G 2320/0233* (2013.01)

(58) Field of Classification Search
CPC ......... G09G 3/3233; G09G 2300/0426; G09G 2300/0819; G09G 2300/0852; G09G 2300/0861; G09G 2320/0233; H03K 17/56
See application file for complete search history.

(56) References Cited

U.S. PATENT DOCUMENTS

| | | | |
|---|---|---|---|
| 8,174,471 | B2 | 5/2012 | Kim et al. |
| 10,147,777 | B2 | 12/2018 | Lim et al. |
| 2018/0174525 | A1 | 6/2018 | Kim et al. |

(Continued)

FOREIGN PATENT DOCUMENTS

| | | | |
|---|---|---|---|
| KR | 1020090073771 | A | 7/2009 |
| KR | 1020180018960 | A | 2/2018 |

(Continued)

*Primary Examiner* — Antonio Xavier

(74) *Attorney, Agent, or Firm* — CANTOR COLBURN LLP

(57) ABSTRACT

An electronic device includes first and second areas, and a third area therebetween in a first direction, pixel drivers each including pixel transistors, a driving circuit in the second area, a first group of light-emitting elements in the second and third areas and each including a first electrode connected to a first group of a pixel driver, a second group of light-emitting elements in the first area and each including a first electrode connected to a second group of pixel driver, connection lines connecting the light-emitting elements and the first and second group of the pixel drivers, respectively, a first conductive layer receiving a first constant voltage, and a second conductive layer receiving a second constant voltage. The connection lines are between the first and second conductive layers, and capacitances between the connection lines and the first electrodes next to the connection lines are uniform in the first direction.

20 Claims, 13 Drawing Sheets

(56) References Cited

U.S. PATENT DOCUMENTS

2023/0217749 A1 7/2023 Kim
2023/0231096 A1* 7/2023 Cha ...................... H10H 20/857
257/91
2024/0274058 A1* 8/2024 Kim ..................... G09G 3/2092

FOREIGN PATENT DOCUMENTS

KR 1020180071466 A 6/2018
KR 1020230103729 A 7/2023

* cited by examiner

FIG. 7

ELECTRONIC DEVICE

BACKGROUND

This application claims priority to Korean Patent Application No. 10-2024-0174685, filed on Nov. 29, 2024, and all the benefits accruing therefrom under 35 U.S.C. § 119, the content of which in its entirety is herein incorporated by reference.

1. Field

The disclosure relates to an electronic device. More particularly, the disclosure relates to a display panel with reduced bezel size and an electronic device including the display panel.

2. Description of Related Art

Multimedia electronic devices, such as televisions, mobile phones, tablet computers, navigation devices, and game devices, include a display panel to display an image.

Recently, in response to market demands, researches are being conducted to reduce the non-display area of the display panel. In addition, studies are underway to expand the display area through which the image is shown to the user and to reduce the bezel.

SUMMARY

The disclosure provides an electronic device with reduced bezel size.

An embodiment of the inventive concept provides an electronic device including a base layer including a first area, a second area spaced apart from the first area in a first direction, and a third area defined between the first area and the second area, pixel drivers each including pixel transistors, a driving circuit spaced apart from the first area, disposed in the second area, and applying an electrical signal to each of the pixel drivers, a first group of light-emitting elements arranged in the second area and the third area, each including a first electrode connected to a first group of pixel driver among the pixel drivers, a second electrode disposed on the first electrode, and a light-emitting layer disposed between the first electrode and the second electrode, a second group of light-emitting elements arranged in the first area, each including a first electrode connected to a second group of pixel driver among the pixel drivers, a second electrode disposed on the first electrode, and a light-emitting layer disposed between the first electrode and the second electrode, connection lines connecting the first and second groups of light-emitting elements and the first and second group of pixel drivers, respectively, a first conductive layer including a plurality of first conductive patterns each receiving a first constant voltage, and a second conductive layer including a plurality of second conductive patterns each receiving a second constant voltage and disposed on the plurality of first conductive patterns. The connection lines are disposed between the first conductive layer and the second conductive layer, and capacitances between the connection lines and the first electrodes next (adjacent) to the connection lines are uniform in the first direction.

In an embodiment, the first group of pixel driver is disposed in the third area, and the second group of pixel driver is disposed in the first area.

In an embodiment, each of the second group of light-emitting elements overlaps the second group of pixel driver.

In an embodiment, the plurality of first conductive patterns and the plurality of second conductive patterns overlap the connection lines in a plan view.

In an embodiment, each of the first and second groups of light-emitting elements receives a first driving voltage, a second driving voltage, a first initialization voltage, and a second initialization voltage, and each of the first constant voltage and the second constant voltage is one of the first driving voltage, the second driving voltage, the first initialization voltage, and the second initialization voltage.

In an embodiment, the first constant voltage is equal to the second constant voltage.

In an embodiment, the electronic device further includes a plurality of contact portions respectively connecting the plurality of first conductive patterns and the second conductive patterns through at least one insulating layer.

In an embodiment, the first constant voltage is different from the second constant voltage.

In an embodiment, the connection lines arranged in the second and third areas among the connection lines have a width smaller than a width of the connection lines arranged in the first area among the connection lines in the plan view.

In an embodiment, each of the connection lines arranged in the third area and next (adjacent) to the first area among the connection lines includes a curved portion in the plan view.

In an embodiment, a width of an active layer of a pixel transistor disposed in the third area among the pixel transistors is greater than a width of an active layer of a pixel transistor disposed in the first area among the pixel transistors in a cross-section.

In an embodiment, the first electrodes respectively included in the first group of light-emitting elements receive a different anode initialization voltage from the first electrodes respectively included in the second group of light-emitting elements.

In an embodiment, each of the first group of light-emitting elements includes a first-first light-emitting element emitting a light with a first color, a first-second light-emitting element emitting a light with a second color different from the first color, and a first-third light-emitting element emitting a light with a third color different from the first and second colors, each of the second group of light-emitting elements includes a second-first light-emitting element emitting a light with the first color, a second-second light-emitting element emitting a light with the second color different from the first color, and a second-third light-emitting element emitting a light with the third color different from the first and second colors, the first-first, first-second, and first-third light-emitting elements receive different anode initialization voltages, and the second-first, second-second, and second-third light-emitting elements receive different anode initialization voltages.

An embodiment of the inventive concept provides an electronic device including a base layer including a first area, a second area spaced apart from the first area in a first direction, and a third area defined between the first area and the second area, pixel drivers each including pixel transistors, a driving circuit spaced apart from the first area, disposed in the second area, and applying an electrical signal to each of the pixel drivers, a first group of light-emitting elements arranged in the second area and the third area, each being connected to a first group of pixel driver including a first pixel transistor among the pixel drivers, a second group of light-emitting elements arranged in the first area, each being connected to a second group of pixel driver including a second pixel transistor among the pixel drivers, connection lines connecting the first and second groups of light-emitting elements and the first and second group of pixel drivers, respectively, a first conductive layer including a plurality of first conductive patterns each receiving a first constant voltage, and a second conductive layer including a plurality of second conductive patterns each receiving a second constant voltage and disposed on the plurality of first conductive patterns. The connection lines are disposed between the first conductive layer and the second conductive layer, and an active layer of the first pixel transistor has a width greater than a width of an active layer of the second pixel transistor in a cross-section.

In an embodiment, the first conductive pattern and the second conductive pattern overlap the connection lines in a plan view.

In an embodiment, the connection lines arranged in the second and third areas among the connection lines have a width smaller than a width of the connection lines arranged in the first area among the connection lines in the plan view.

In an embodiment, each of the first and second groups of light-emitting elements receives a first driving voltage, a second driving voltage, a first initialization voltage, and a second initialization voltage, and each of the first constant voltage and the second constant voltage is one of the first driving voltage, the second driving voltage, the first initialization voltage, and the second initialization voltage.

In an embodiment, the first constant voltage is equal to the second constant voltage.

In an embodiment, the first constant voltage is different from the second constant voltage.

In an embodiment, first electrodes respectively included in the first and second groups of the light-emitting elements receive different anode initialization voltages.

According to the above, the conductive layers are respectively disposed below and above the connection line, which connects the light-emitting element and the pixel transistor, and serve as shielding layers between the connection line and an anode overlapping the connection line and between the connection line and the pixel transistor overlapping the connection line. Thus, differences in luminance among the light-emitting elements are reduced.

According to the above, the width and length of each of the connection lines are designed differently depending on its position to reduce variations in anode capacitance among the light-emitting elements, and thus, the reliability of the electronic device is enhanced.

BRIEF DESCRIPTION OF THE DRAWINGS

The above and other embodiments, advantages and features of this disclosure will become more apparent by describing in further detail embodiments thereof with reference to the accompanying drawings, in which:

FIG. 7 is a plan view of an embodiment of a display panel according to the present disclosure;

DETAILED DESCRIPTION

Figure 1A:
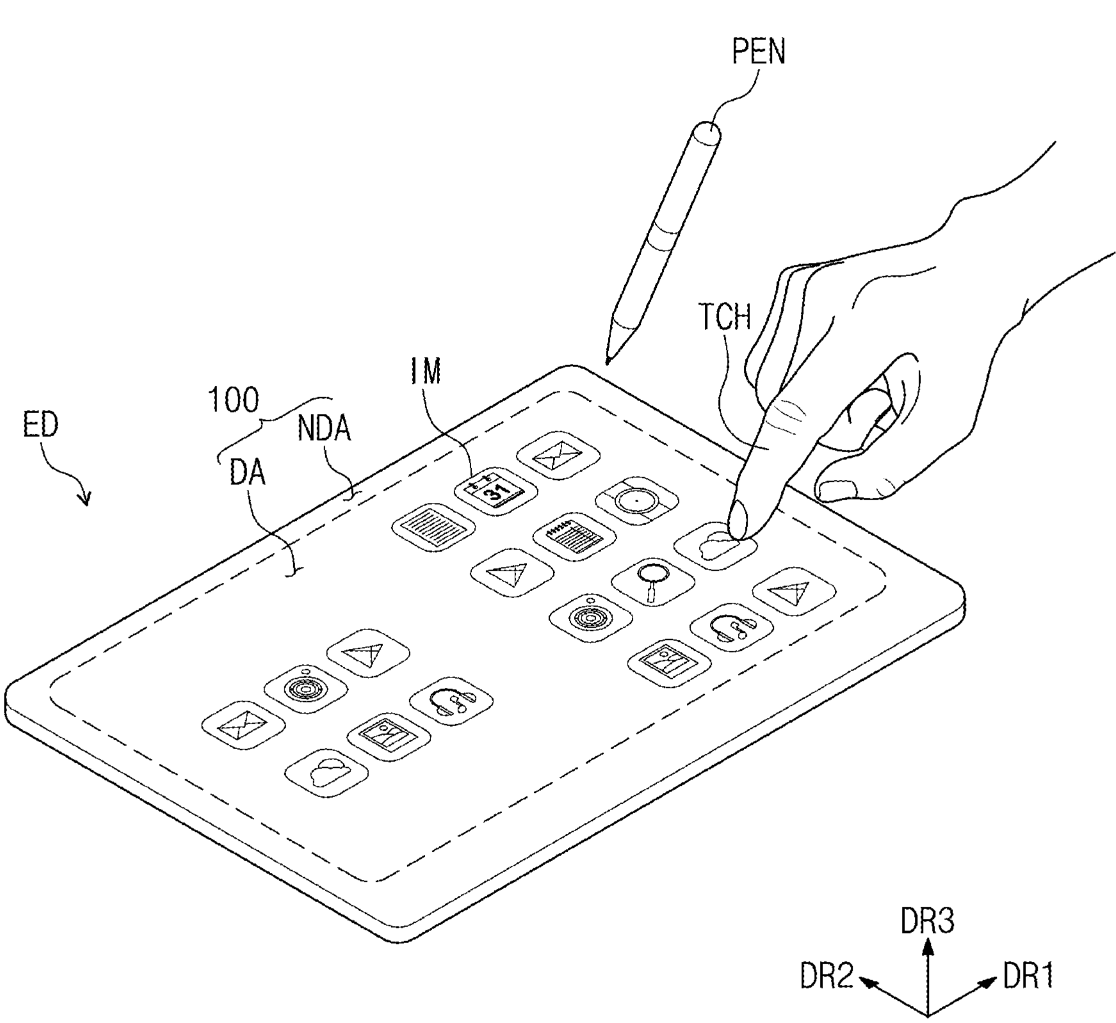
FIG. 1A is a perspective view of an embodiment of an electronic device according to the disclosure.

In the disclosure, it will be understood that when an element (or area, layer, or portion) is referred to as being "on", "connected to" or "coupled to" another element or layer, it may be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" or the like, may be used herein for ease of description to describe one element or feature's relationship to another elements or features as shown in the drawing figures.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure will be described with reference to accompanying drawings.

Figure 1B:
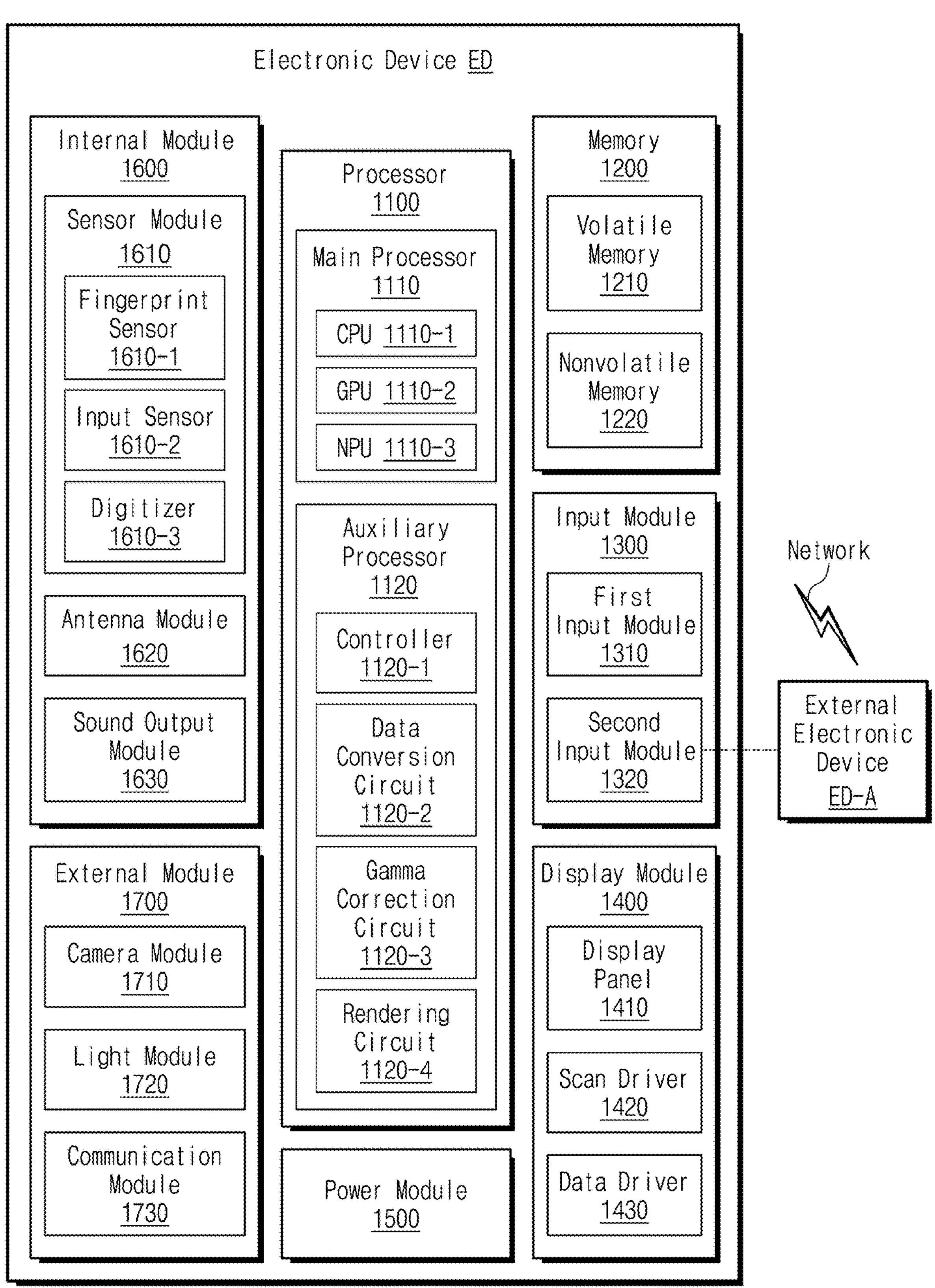
FIG. 1B is a block diagram of an embodiment of an electronic device according to the disclosure.

FIG. 1A is a perspective view of an embodiment of an electronic device according to the disclosure, and FIG. 1B is a block diagram of an embodiment of an electronic device according to the disclosure.

Referring to FIG. 1A, the electronic device ED may have long sides extending parallel to a first direction DR1 and short sides extending parallel to a second direction DR2, which intersects the first direction DR1. However, this is merely one of embodiments, and the electronic device ED may also have sides of equal length in both the first and second directions DR1 and DR2.

Hereinafter, a direction substantially perpendicular to a plane defined by the first direction DR1 and the second direction DR2 is also referred to as a third direction DR3. In the following descriptions, the expression "in a plan view" may mean a state of being viewed in the third direction DR3.

A front surface of the electronic device ED may be defined as a display surface 100 and may include the plane defined by the first direction DR1 and the second direction DR2. Images IM generated by the electronic device ED may be provided to a user through the display surface 100.

The display surface 100 may include a display area DA and a non-display area NDA around the display area DA. The display area DA may be an area through which the images IM are displayed, and the non-display area NDA may be an area through which the images IM are not displayed. The non-display area NDA may be defined next (adjacent) to at least one side of the display area DA. In the illustrated embodiment, the non-display area NDA may have a frame shape surrounding the display area DA. However, this is merely one of embodiments, the non-display area NDA may be omitted, and in this case, the display surface 100 may include only the display area DA.

The electronic device ED may sense an external input applied thereto from the outside. In an embodiment, the electronic device ED may sense a first input generated by a touch TCH and a second input generated by a touch pen PEN. The first input generated by the touch TCH may include various forms of external inputs, such as a touch input by a user's body part, light, heat, or pressure, but it should not be particularly limited, for example. The touch pen PEN may include an active pen, an electromagnetic pen, or the like, however, it should not be particularly limited. The touch pen PEN may be defined as an input device, and the display area DA may provide the user with a sensing area that is capable of detecting inputs in addition to displaying the images IM.

The electronic device ED may be applied to a large-sized electronic item, such as a television set, a monitor, or an outdoor billboard. In addition, the electronic device ED may be applied to a relatively small and medium-sized electronic item, such as a personal computer, a notebook computer, a personal digital assistant, a car navigation unit, a game unit, a smartphone, a tablet computer, or a camera. However, these are merely illustrative embodiments, and the electronic device ED may be applied to other electronic items as long as they do not depart from the inventive concept of the disclosure. FIGS. 1A and 1B show the tablet computer as the electronic device ED.

Referring to FIG. 1B, the electronic device ED may output various pieces of information through the display module 1400 within an operating system. When a processor 1100 executes applications stored in a memory 1200, the display module 1400 may provide application information to the user through a display panel 1410.

The processor 1100 may obtain the external input through an input module 1300 or a sensor module 1610 and may execute an application corresponding to the external input. In an embodiment, when the user selects a camera icon displayed on the display panel 1410 (or DP of FIG. 2), the processor 1100 may obtain a user input through an input sensor 1610-2 and may activate a camera module 1710. The processor 1100 may transmit image data corresponding to a captured image acquired through the camera module 1710 to the display module 1400. The display module 1400 may display an image corresponding to the captured image through the display panel 1410.

In the above descriptions, the operation of the electronic device ED is briefly described. Hereinafter, components of the electronic device ED will be described in detail. Some of the components of the electronic device ED described below may be integrated and provided as a single component, or one component may be provided after being separated into two or more components.

Referring to FIG. 1B, the electronic device ED may communicate with an external electronic device ED-A through a network (e.g., a short-range wireless communication network or a long-range wireless communication network). In an embodiment, the electronic device ED may include the processor 1100, the memory 1200, the input module 1300, the display module 1400, a power module 1500, an internal module 1600, and an external module 1700. In an embodiment, in the electronic device ED, at least one of the above-described components may be omitted, or one or more other components may be added. In an embodiment, some of the above-described components (e.g., the sensor module 1610, an antenna module 1620, or an audio output module 1630) may be integrated into another component (e.g., the display module 1400).

The processor 1100 may execute software to control at least one other component (e.g., a hardware or software component) of the electronic device ED connected to the processor 1100 and may perform various data processing or computational operations. In an embodiment, as at least a part of the data processing or computational operations, the processor 1100 may store commands or data received from other components (e.g., the input module 1300, the sensor module 1610, or a communication module 1730) in a volatile memory 1210, may process the commands or data stored in the volatile memory 1210, and may store result data in a nonvolatile memory 1220.

The processor 1100 may include a main processor 1110 and an auxiliary processor 1120. The main processor 1110 may include one or both of a central processing unit ("CPU") 1110-1 and an application processor ("AP"). The main processor 1110 may further include any one or more of a graphics processing unit ("GPU") 1110-2, a communication processor ("CP"), and an image signal processor ("ISP"). The main processor 1110 may further include a neural processing unit ("NPU") 1110-3. The NPU is a processor specialized in processing an artificial intelligence model, and the artificial intelligence model may be generated through machine learning. The artificial intelligence model may include a plurality of artificial neural network layers. The artificial neural network may be one of a deep neural network ("DNN"), a convolutional neural network ("CNN"), a recurrent neural network ("RNN"), a restricted boltzmann machine ("RBM"), a deep belief network ("DBN"), a bidirectional recurrent deep neural network ("BRDNN"), a deep Q-network, or a combination of two or more of the above, but is not limited to the above-described example. Additionally or alternatively, the artificial intelligence model may include a software structure in addition to a hardware structure. At least two of the above-described processing units and processors may be implemented as a single integrated component (e.g., a single chip) or as separate components (e.g., a plurality of chips).

The auxiliary processor 1120 may include a controller 1120-1. The controller 1120-1 may include an interface conversion circuit and a timing control circuit. The controller 1120-1 may receive an image signal from the main processor 1110, convert a data format of the image signal to correspond to an interface specification with the display module 1400, and output image data. The controller 1120-1 may output various control signals desired for driving the display module 1400.

The auxiliary processor 1120 may further include a data conversion circuit 1120-2, a gamma correction circuit 1120-3, a rendering circuit 1120-4, or the like. The data conversion circuit 1120-2 may receive the image data from the controller 1120-1, compensate for the image data to display an image with a desired luminance based on characteristics of the electronic device ED, user settings, or the like, or convert the image data to reduce power consumption or to compensate for image retention. The gamma correction circuit 1120-3 may convert the image data, a gamma reference voltage, or the like so that the image displayed on the electronic device ED has a desired gamma characteristic. The rendering circuit 1120-4 may receive the image data from the controller 1120-1 and render the image data taking into account a pixel arrangement or the like of the display panel 1410 applied to the electronic device ED. At least one of the data conversion circuit 1120-2, the gamma correction circuit 1120-3, and the rendering circuit 1120-4 may be integrated into another component (e.g., the main processor 1110 or the controller 1120-1). At least one of the data conversion circuit 1120-2, the gamma correction circuit 1120-3, and the rendering circuit 1120-4 may be integrated into a data driver 1430, which is described later.

The memory 1200 may store various data used by at least one component (e.g., the processor 1100 or the sensor module 1610) of the electronic device ED and input or output data related to corresponding commands. The memory 1200 may include at least one of the volatile memory 1210 and the nonvolatile memory 1220.

The input module 1300 may receive commands or data to be used by a component (e.g., the processor 1100, the sensor module 1610, or the audio output module 1630) of the electronic device ED from an external source (e.g., the user or the external electronic device ED-A) of the electronic device ED.

The input module 1300 may include a first input module 1310 receiving commands or data from the user and a second input module 1320 receiving commands or data from the external electronic device ED-A. The first input module 1310 may include a microphone, a mouse, a keyboard, a key (e.g., a button), or a pen (e.g., a passive pen or an active pen). The second input module 1320 may support a designated protocol that enables connection to the external electronic device ED-A via a wired or wireless connection. In an embodiment, the second input module 1320 may include a high definition multimedia interface ("HDMI"), a universal serial bus ("USB") interface, a secure digital ("SD") card interface, or an audio interface. The second input module 1320 may include a connector capable of physically connecting to the external electronic device ED-A, e.g., an HDMI connector, a USB connector, an SD card connector, or an audio connector (e.g., a headphone connector).

The display module 1400 may provide visual information to the user. The display module 1400 may include the display panel 1410 (or DP of FIG. 2), a scan driver 1420, and the data driver DDC (refer to FIG. 2). The display module 1400 may further include a window, a chassis, and a bracket to protect the display panel 1410.

The display panel 1410 may include a liquid crystal display panel, an organic light-emitting display panel, or an inorganic light-emitting display panel, and a type of the display panel 1410 should not be particularly limited. The display panel 1410 may be a rigid type or a flexible type that may be rolled or folded. The display module 1400 may further include a supporter, a bracket, a heat dissipation member, or the like that supports the display panel 1410.

The scan driver 1420 may be disposed (e.g., mounted) on the display panel 1410 as a driving chip. In addition, the scan driver 1420 may be integrated in the display panel 1410 In an embodiment, the scan driver 1420 may include an amorphous silicon TFT gate driver circuit ("ASG"), a low temperature polycrystalline silicon ("LTPS") TFT gate driver circuit, or an oxide semiconductor TFT gate driver circuit ("OSG") built in the display panel 1410, for example. The scan driver 1420 may receive a control signal from the controller 1120-1 and output scan signals to the display panel 1410 in response to the control signal.

The display panel 1410 may further include an emission driver. The emission driver may output an emission control signal to the display panel 1410 in response to a control signal received from the controller 1120-1. The emission driver may be formed separately from the scan driver 1420 or may be integrated into the scan driver 1420.

The data driver 1430 may receive a control signal from the controller 1120-1, convert image data into an analog voltage (e.g., a data voltage) in response to the control signal, and then output the data voltages to the display panel 1410.

The data driver 1430 may be integrated into another component (e.g., the controller 1120-1). A function of the interface conversion circuit and the timing control circuit of the controller 1120-1 described above may be integrated into the data driver DDC.

The display module 1400 may further include the emission driver, a voltage generation circuit, or the like. The voltage generation circuit may output various voltages desired for driving the display panel 1410.

The power module 1500 may supply power to components of the electronic device ED. The power module 1500 may include a battery that charges a power voltage. The battery may include a non-rechargeable primary cell, a rechargeable secondary cell, or fuel cell. The power module 1500 may include a power management integrated circuit ("PMIC"). The PMIC may supply optimized power to each of the above-described modules and modules described later. The power module 1500 may include a wireless power transmission/reception member electrically connected to the battery. The wireless power transmission/reception member may include a plurality of antenna radiators of a coil form.

The electronic device ED may further include the internal module 1600 and the external module 1700. The internal module 1600 may include the sensor module 1610, the antenna module 1620, and the audio output module 1630. The external module 1700 may include the camera module 1710, a light module 1720, and the communication module 1730.

The sensor module 1610 may sense an input by a body of the user or an input by a pen of the first input module 1310 and may generate an electrical signal or a data value corresponding to the input. The sensor module 1610 may include at least one of a fingerprint sensor 1610-1, the input sensor 1610-2, and a digitizer 1610-3.

The fingerprint sensor 1610-1 may generate a data value corresponding to a fingerprint of the user. The fingerprint sensor 1610-1 may include any one of an optical type fingerprint sensor or a capacitive type fingerprint sensor.

The input sensor 1610-2 may generate a data value corresponding to coordinate information of the input by the body of the user or the input by the pen. The input sensor 1610-2 may generate the data value based on changes in capacitance caused by the input. The input sensor 1610-2 may sense an input by the passive pen or may transmit/receive data to and from the active pen.

The input sensor 1610-2 may measure a biometric signal such as blood pressure, hydration levels, or body fat. In an embodiment, when the user touches a part of their body to a sensor layer or a sensing panel and remains still for a predetermined period, the input sensor 1610-2 may sense the biometric signal based on changes in an electric field caused by the body part and output information desired by the user to the display module 1400, for example.

The digitizer 1610-3 may generate a data value corresponding to coordinate information of the input by the pen. The digitizer 1610-3 may generate the data value based on changes in an electromagnetic field caused by the input. The digitizer 1610-3 may sense the input by the passive pen or may transmit/receive data to and from the active pen.

At least one of the fingerprint sensor 1610-1, the input sensor 1610-2, and the digitizer 1610-3 may be implemented as a sensor layer formed on the display panel 1410 through a continuous process. The fingerprint sensor 1610-1, the input sensor 1610-2, and the digitizer 1610-3 may be disposed above the display panel 1410, or any one of the fingerprint sensor 1610-1, the input sensor 1610-2, and the digitizer 1610-3, e.g., the digitizer 1610-3, may be disposed below the display panel 1410.

At least two of the fingerprint sensor 1610-1, the input sensor 1610-2, and the digitizer 1610-3 may be integrated into a single sensing panel through the same process. When at least two of the fingerprint sensor 1610-1, the input sensor 1610-2, and the digitizer 1610-3 are integrated into one sensing panel, the sensing panel may be disposed between the display panel 1410 and the window disposed above the display panel 1410. In an embodiment, the sensing panel may be disposed on the window, and a position of the sensing panel should not be particularly limited.

At least one of the fingerprint sensor 1610-1, the input sensor 1610-2, and the digitizer 1610-3 may be embedded in the display panel 1410. That is, at least one of the fingerprint sensor 1610-1, the input sensor 1610-2, and the digitizer 1610-3 may be simultaneously formed through a process of forming elements (e.g., a light-emitting element, a transistor, or the like) included in the display panel 1410.

In addition, the sensor module 1610 may generate an electrical signal or a data value corresponding to an internal state or an external state of the electronic device ED. The sensor module 1610 may further include, e.g., a gesture sensor, a gyro sensor, a barometric pressure sensor, a magnetic sensor, an acceleration sensor, a grip sensor, a proximity sensor, a color sensor, an infrared ("IR") sensor, a biometric sensor, a temperature sensor, a humidity sensor, or an illuminance sensor.

The antenna module 1620 may include one or more antennas to transmit a signal or power to an external source or to receive a signal or power from an external source. In an embodiment, the communication module 1730 may transmit a signal to an external electronic device or may receive a signal from an external electronic device through an antenna suitable for a communication method. An antenna pattern of the antenna module 1620 may be integrated into one component (e.g., the display panel 1410) of the display module 1400 or the input sensor 1610-2.

The audio output module 1630 is a device to output an audio signal to an outside of the electronic device ED and, e.g., may include a speaker used for general purposes such as multimedia playback or recording playback and a receiver used exclusively to receive a phone call. In an embodiment, the receiver may be formed integrally with or separately from the speaker. An audio output pattern of the audio output module 1630 may be integrated into the display module 1400.

The camera module 1710 may capture a still image and a video. In an embodiment, the camera module 1710 may include one or more lenses, an image sensor, or an image signal processor. The camera module 1710 may further include an infrared camera capable of measuring presence or absence of the user, a position of the user, a line of sight of the user, or the like.

The light module 1720 may provide light. The light module 1720 may include a light-emitting diode or a xenon lamp. The light module 1720 may operate in conjunction with the camera module 1710 or may operate independently.

The communication module 1730 may support the establishment of a wired or wireless communication channel between the electronic device ED and the external electronic device ED-A and the communication through the established communication channel. The communication module 1730 may include one or both of a wireless communication module, such as a cellular communication module, a short-range wireless communication module, or a global navigation satellite system ("GNSS") communication module, and a wired communication module, such as a local area network ("LAN") communication module or a power line communication module. The communication module 1730 may communicate with the external electronic device ED-A through a short-range communication network, such as Bluetooth®, WiFi direct, or infrared data association ("IrDA"), or a long-range communication network, such as a cellular network, the Internet, or a computer network (e.g., LAN or WAN). The various types of communication modules 1730 described above may be implemented as a single chip or as separate chips.

The input module 1300, the sensor module 1610, the camera module 1710, or the like may be used in conjunction with the processor 1100 to control an operation of the display module 1400.

The processor 1100 may output commands or data to the display module 1400, the audio output module 1630, the camera module 1710, or the light module 1720 based on input data received from the input module 1300. In an embodiment, the processor 1100 may generate image data in response to the input data applied through the mouse, the active pen, or the like and output the image data to the display module 1400 or may generate command data in response to the input data and output the command data to the camera module 1710 or the light module 1720. When no input data is received from the input module 1300 for a predetermined period of time, the processor 1100 may switch the operation mode of the electronic device ED to a relatively low power mode or a sleep mode to reduce power consumed in the electronic device ED.

The processor 1100 may output commands or data to the display module 1400, the audio output module, the camera module 1710, or the light module 1720 based on sensing data received from the sensor module 1610. In an embodiment, the processor 1100 may compare authentication data applied by the fingerprint sensor 1610-1 with authentication data stored in the memory 1200 and then execute an application according to a comparison result, for example. The processor 1100 may execute the command based on sensing data sensed by the input sensor 1610-2 or the digitizer 1610-3 or may output image data corresponding to the sensing data to the display module 1400. When the sensor module 1610 includes a temperature sensor, the processor 1100 may receive temperature data measured by the sensor module 1610 and further perform luminance correction or the like on the image data based on the temperature data.

The processor 1100 may receive measurement data regarding the presence or absence of the user, the position of the user, the line of sight of the user, or the like, from the camera module 1710. The processor 1100 may further perform luminance correction or the like on the image data based on the measurement data. In an embodiment, when the processor 1100 determines the presence or absence of the user through an input from the camera module 1710, the processor 1100 may output image data whose luminance is corrected through the data conversion circuit 1120-2 or the gamma correction circuit 1120-3 to the display module 1400, for example.

Among the above-described components, some components may be connected to each other through a communication method between peripheral devices, e.g., a bus, general purpose input/output ("GPIO"), a serial peripheral interface ("SPI"), a mobile industry processor interface ("MIPI"), or an ultra path interconnect ("UPI") link to exchange a signal (e.g., commands or data) with each other. The processor 1100 may communicate with the display module 1400 through a mutually agreed interface, e.g., any one of the above-described communication methods, and the communication method should not be limited to the above-described communication methods.

The electronic device ED according to various embodiments of the disclosure may be applied to various types of devices. The electronic device ED may include, e.g., at least one of a portable communication device (e.g., a smartphone), a computer device, a portable multimedia device, a portable medical device, a camera, a wearable device, and a home appliance device. The electronic device ED according to various embodiments of the disclosure should not be limited to the above-described devices.

Figure 2:
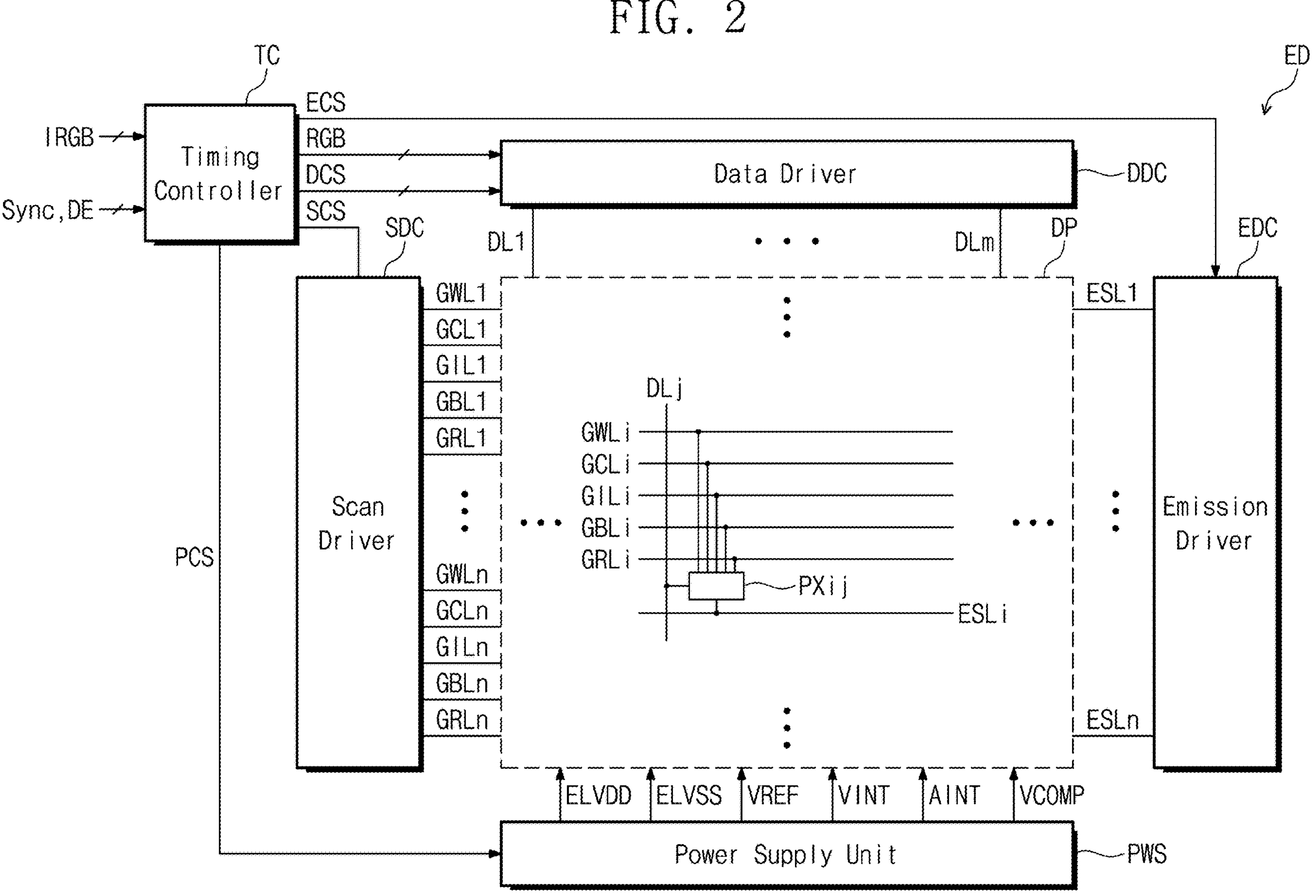
FIG. 2 is a block diagram of an embodiment of a display device according to the disclosure.

FIG. 2 is a block diagram of an embodiment of an electronic device according to the disclosure.

Referring to FIG. 2, the electronic device ED may include a display panel DP, panel drivers SDC, EDC, and DDC, a power supply unit PWS, and a timing controller TC. In the illustrated embodiment, the display panel DP may be a light-emitting type display panel. The light-emitting type display panel may be an organic light-emitting display panel, an inorganic light-emitting display panel, or a quantum dot light-emitting display panel. Hereinafter, the organic light-emitting display panel will be described as an illustrative embodiment of the display panel DP. The panel drivers may include the scan driver SDC (or 1420 in FIG. 1B), an emission driver EDC, and the data driver DDC.

The display panel DP may include scan lines GWL1 to GWLn, GCL1 to GCLn, GIL1 to GILn, GBL1 to GBLn, and GRL1 to GRLn, emission lines ESL1 to ESLn, and data lines DL1 to DLm. The display panel DP may include a plurality of pixels connected to the scan lines GWL1 to GWLn, GCL1 to GCLn, GIL1 to GILn, GBL1 to GBLn, and GRL1 to GRLn, the emission lines ESL1 to ESLn, and the data lines DL1 to DLm. Each of "m" and "n" is an integer number greater than 1.

In an embodiment, a pixel PXij (each of "i" and "j" is an integer number greater than 1) disposed to correspond to an i-th horizontal line (or an i-th pixel row) and a j-th vertical line (or a j-th pixel column) may be connected to an i-th first scan line (or a write scan line) GWLi, an i-th second scan line (or a compensation scan line) GCLi, an i-th third scan line (or a first initialization scan line) GILi, an i-th fourth scan line (or a second initialization scan line) GBLi, an i-th fifth scan line (or a reset scan line) GRLi, a j-th data line DLj, and an i-th emission line ESLi.

The pixel PXij may include a plurality of light-emitting elements, a plurality of transistors, and a plurality of capacitors. The pixel PXij may receive a first power voltage ELVDD, a second power voltage ELVSS, a third power voltage (or a reference voltage) VREF, a fourth power voltage (or a first initialization voltage) VINT, a fifth power voltage (or a second initialization voltage) AINT, and a sixth power voltage (or a compensation voltage) VCOMP from the power supply unit PWS. The power voltages from the power supply unit PWS may be a constant voltage.

The first power voltage ELVDD and the second power voltage ELVSS may have a voltage value set to allow current to flow through the light-emitting element, enabling the light-emitting element to emit light. In an embodiment, the first power voltage ELVDD may be set to have a voltage level higher than that of the second power voltage ELVSS.

The third power voltage VREF may be a voltage to initialize a gate of a driving transistor included in the pixel PXij. The third power voltage VREF may be used to implement a selected grayscale utilizing a difference in voltage between the third power voltage VREF and a data signal. To this end, the third power voltage VREF may be set to a selected voltage within a voltage range of the data signal.

The fourth power voltage VINT may be used to initialize the capacitor included in the pixel PXij. The fourth power voltage VINT may be set to a voltage level lower than that of the third power voltage VREF. In an embodiment, the fourth power voltage VINT may be set to a voltage level lower than a difference between the third power voltage VREF and a threshold voltage of the driving transistor, however, the disclosure should not be limited thereto or thereby.

The fifth power voltage AINT may be used to initialize an anode of the light-emitting element included in the pixel PXij. The fifth power voltage AINT may be set to a voltage level lower than the first power voltage ELVDD or the fourth power voltage VINT or may be set to a voltage level similar to or the same as the third power voltage VREF, however, it should not be limited thereto or thereby. The fifth power voltage AINT may be set to a voltage level similar to or the same as the first power voltage ELVDD. The sixth power voltage VCOMP may provide a selected current to the driving transistor when the threshold voltage of the driving transistor is compensated for.

FIG. 2 shows a structure in which all the first, second, third, fourth, fifth, and sixth power voltages ELVDD, ELVSS, VREF, VINT, AINT, and VCOMP are provided from the power supply unit PWS, however, the disclosure should not be limited thereto or thereby. In an embodiment, both of the first power voltage ELVDD and the second power voltage ELVSS may be provided regardless of the structure of the pixel PXij, and at least one of the third power voltage VREF, the fourth power voltage VINT, the fifth power voltage AINT, and the sixth power voltage VCOMP may not be provided according to the structure of the pixel PXij. According to the disclosure, signal lines connected to the pixel PXij may be designed in various ways by taking into account the structure of the pixel PXij.

The scan driver SDC (or 1420 in FIG. 1B) may receive a first control signal SCS from the timing controller TC and may provide a scan signal to the first scan lines GWL1 to GWLn, the second scan lines GCL1 to GCLn, the third scan lines GIL1 to GILn, the fourth scan lines GBL1 to GBLn, and the fifth scan lines GRL1 to GRLn in response to the first control signal SCS.

The scan signal may be set to a voltage that allows the transistors to be turned on in response to the scan signal. In an embodiment, the scan signal provided to a P-type transistor may be set to a logic low level, and the scan signal provided to an N-type transistor may be set to a logic high level. Hereinafter, the expression "the scan signal is provided" may mean that the scan signal is provided to the transistor, which is controlled thereby, with a logic level that turns on the transistor.

For the convenience of explanation, FIG. 2 shows one scan driver SDC (or 1420 in FIG. 1B), however, the disclosure should not be limited thereto or thereby. In an embodiment, the electronic device ED may include multiple scan drivers to provide the scan signal to the first scan lines GWL1 to GWLn, the second scan lines GCL1 to GCLn, the third scan lines GIL1 to GILn, the fourth scan lines GBL1 to GBLn, and the fifth scan lines GRL1 to GRLn.

The emission driver EDC may provide emission signals to the emission lines ESL1 to ESLn in response to a second control signal ECS. In an embodiment, the emission signals may be sequentially provided to the emission lines ESL1 to ESLn.

Each transistor connected to the emission lines ESL1 to ESLn may be the N-type transistor. In this case, the emission signals provided to the emission lines ESL1 to ESLn may have a gate-off voltage. The transistors receiving the emission signal may be turned off when receiving the emission signal and may be turned on in other cases.

The second control signal ECS may include an emission start signal and clock signals, and the emission driver EDC may be implemented by a shift register that sequentially shifts the emission start signal with a pulse shape using the clock signals to sequentially generate and output the emission signal with a pulse shape.

The data driver DDC may receive a third control signal DCS and image data RGB from the timing controller TC. The data driver DDC may convert the image data RGB in a digital form to analog data signals. The data driver DDC may provide the data signal to the data lines DL1 to DLm in response to the third control signal DCS.

The third control signal DCS may include a data enable signal, a horizontal start signal, and a data clock signal to indicate the output of a valid data signal In an embodiment, the data driver DDC may include a shift register that shifts the horizontal start signal in synchronization with the data clock signal to generate a sampling signal, a latch that latches the image data RGB in response to the sampling signal, a digital-analog converter (or a decoder) that converts the latched image data, e.g., data in the digital form, to data signals in the analog form, and buffers (or amplifiers) that output the data signals to the data lines DL1 to DLm.

The power supply unit PWS may provide the first power voltage ELVDD, the second power voltage ELVSS, and the third power voltage VREF to the display panel DP to drive the pixel PXij. In addition, the power supply unit PWS may provide at least one voltage of the fourth power voltage VINT, the fifth power voltage AINT, and the sixth power voltage VCOMP to the display panel DP.

In an embodiment, the power supply unit PWS may provide the first power voltage ELVDD, the second power voltage ELVSS, the third power voltage VREF, the fourth power voltage VINT, the fifth power voltage AINT, and the sixth power voltage VCOMP to the display panel DP respectively via a first power line, a second power line, a third power line (or a reference voltage line) VRL, a fourth power line (or a first initialization voltage line), a fifth power line (or a second initialization voltage line), and a sixth power line (or a compensation voltage line), which are not shown in FIG. 2.

The power supply unit PWS may be implemented as a power management IC, however, the disclosure should not be limited thereto or thereby.

The timing controller TC may generate the first control signal SCS, the second control signal ECS, the third control signal DCS, and a fourth control signal PCS based on input image data IRGB, a synchronization signal Sync, e.g., a vertical synchronization signal, a horizontal synchronization signal, etc., the data enable signal DE, and a clock signal. The first control signal SCS may be applied to the scan driver SDC (or 1420 in FIG. 1B), the second control signal ECS may be applied to the emission driver EDC, the third control signal DCS may be applied to the data driver DDC, and the fourth control signal PCS may be applied to the power supply unit PWS. The timing controller TC may rearrange the input image data IRGB to correspond to an arrangement of the pixel PXij in the display panel DP and may generate the image data RGB (or frame data).

The scan driver SDC (or 1420 in FIG. 1B), the emission driver EDC, the data driver DDC, the power supply unit PWS, and/or the timing controller TC may be directly formed in the display panel DP or may be connected to the display panel DP after being manufactured as a separate driving chip. In addition, at least two of the scan driver SDC (or 1420 in FIG. 1B), the emission driver EDC, the data driver DDC, the power supply unit PWS, and the timing controller TC may be provided in a single driving chip. In an embodiment, the data driver DDC and the timing controller TC may be provided in a single driving chip.

Although the electronic device ED in an embodiment is described with reference to FIG. 2 in the above descriptions, the electronic device ED of the disclosure should not be limited thereto or thereby. Signal lines may be added or omitted depending on the structure of the pixels. In addition, a connection relationship between the one pixel and the signal lines may be changed. In a case where one of the signal lines is omitted, the omitted signal line may be replaced with another signal line.

Figure 3:
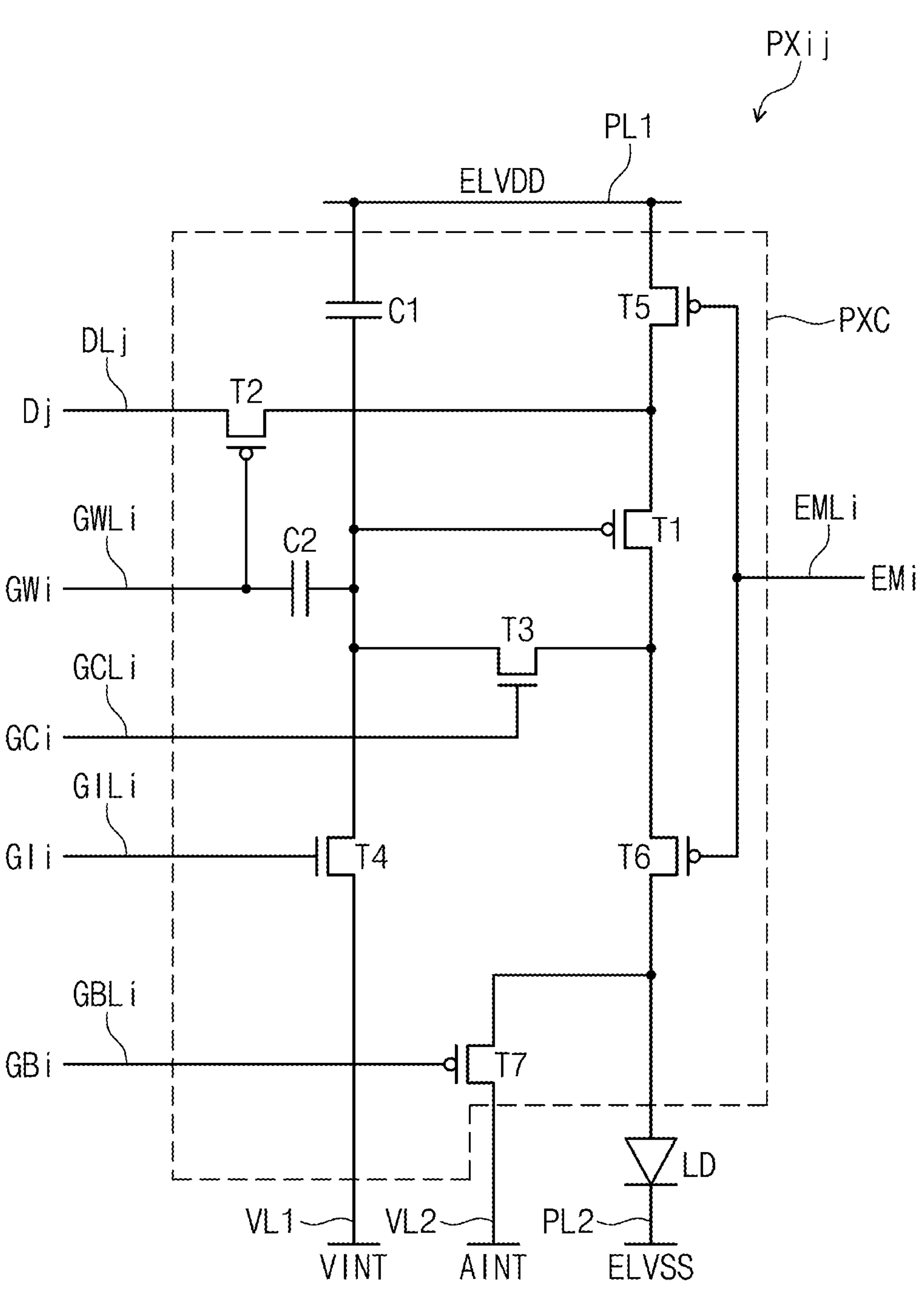
FIG. 3 is an equivalent circuit diagram of an embodiment of a pixel according to the disclosure.

FIG. 3 is a circuit diagram of an embodiment of the pixel PXij according to the disclosure.

FIG. 3 shows an equivalent circuit diagram of the pixel PXij connected to the j-th data line DLj, an i-th initialization gate line GILi, an i-th black gate line GBLi, an i-th write gate line GWLi, an i-th compensation gate line GCLi, and an i-th emission control line EMLi. Each of the pixels PX shown in FIG. 2 may have substantially the same configuration as the pixel PXij shown in FIG. 3.

The pixel PXij may include a light-emitting element LD and a pixel circuit PXC electrically connected to the light-emitting element LD. The pixel circuit PXC may include first, second, third, fourth, fifth, sixth, and seventh transistors T1, T2, T3, T4, T5, T6, and T7, a first capacitor C1, and a second capacitor C2.

Among the first, second, third, fourth, fifth, sixth, and seventh transistors T1, T2, T3, T4, T5, T6, and T7, each of the third and fourth transistors T3 and T4 may be an N-type transistor including an oxide semiconductor layer, and each of the first, second, fifth, sixth, seventh transistors T1, T2, T5, T6, T7 may be a P-type transistor including a low-temperature polycrystalline silicon ("LTPS") semiconductor layer. However, the disclosure should not be limited thereto or thereby, and the first, second, third, fourth, fifth, sixth, and seventh transistors T1, T2, T3, T4, T5, T6, and T7 may all be the P-type transistor or may all be the N-type transistor. In an embodiment, at least one of the first, second, third, fourth, fifth, sixth, and seventh transistors T1, T2, T3, T4, T5, T6, and T7 may be the N-type transistor, and remaining (the other) transistors of the first, second, third, fourth, fifth, sixth, and seventh transistors T1, T2, T3, T4, T5, T6, and T7 may be the P-type transistor.

The i-th initialization gate line GILi may transmit an initialization gate signal GIi, the i-th black gate line GBLi may transmit a black gate signal GBi, the i-th write gate line GWLi may transmit a write gate signal GWi, the i-th compensation gate line GCLi may transmit a compensation gate signal GCi, the i-th emission control line EMLi may transmit an emission control signal EMi, and the j-the data line DLj may transmit a data signal Dj. The data signal Dj may have a voltage level corresponding to a grayscale value of image data RGB output from a timing controller TC.

In addition, the pixel PXij may be electrically connected to a first initialization voltage line VL1, a second initialization voltage line VL2, a first driving voltage line PL1, and a second driving voltage line PL2.

The first driving voltage line PL1 may transmit the first driving voltage ELVDD. The second driving voltage line PL2 may transmit the second driving voltage ELVSS. The first initialization voltage line VL1 may transmit the first initialization voltage VINT. The second initialization voltage line VL2 may transmit the second initialization voltage AINT (or an anode initialization voltage).

The first transistor T1 may include a first electrode connected to the first driving voltage line PL1 via the fifth transistor T5, a second electrode electrically connected to the anode of the light-emitting element LD via the sixth transistor T6, and a gate electrode connected to one end of the first capacitor C1. The first transistor T1 may receive the data signal Dj transmitted through a j-th data line DLj in response to a switching operation of the second transistor T2 and may supply a driving current to the light-emitting element LD.

The second transistor T2 may include a first electrode connected to the j-th data line DLj, a second electrode connected to the first electrode of the first transistor T1, and a gate electrode connected to the i-th write gate line GWLi. The second transistor T2 may be turned on in response to the write gate signal GWi applied via the i-th write gate line GWLi and may transmit the data signal Dj from the j-th data line DLj to the first electrode of the first transistor T1.

The third transistor T3 may include a first electrode connected to the gate electrode of the first transistor T1, a second electrode connected to the second electrode of the first transistor T1, and a gate electrode connected to the i-th compensation gate line GCLi. The third transistor T3 may be turned on in response to the compensation gate signal GCi applied via the i-th compensation gate line GCLi and may connect the gate electrode and the second electrode of the first transistor T1 to each other to allow the first transistor T1 to be connected in a diode configuration.

The fourth transistor T4 may include a first electrode connected to the gate electrode of the first transistor T1, a second electrode connected to the first initialization voltage line VL1 to which the first initialization voltage VINT is applied, and a gate electrode connected to the i-th initialization gate line GILi. The fourth transistor T4 may be turned on in response to the initialization gate signal GIi applied via the i-th initialization gate line GILi. The turned-on fourth transistor T4 may transmit the first initialization voltage VINT to the gate electrode of the first transistor T1 to perform an initialization operation that initializes a voltage of the gate electrode of the first transistor T1.

The fifth transistor T5 may include a first electrode connected to the first driving voltage line PL1, a second electrode connected to the first electrode of the first transistor T1, and a gate electrode connected to the i-th emission control line EMLi.

The sixth transistor T6 may include a first electrode connected to the second electrode of the first transistor T1, a second electrode connected to the anode of the light-emitting element LD, and a gate electrode connected to the i-th emission control line EMLi.

The fifth transistor T5 and the sixth transistor T6 may be simultaneously turned on in response to the emission control signal EMi applied via the i-th emission control line EMLi, and thus, the first driving voltage ELVDD may be compensated for by the first transistor T1 connected in the diode configuration and may be applied to the light-emitting element LD. The emission control signal EMi may have a turn-on period in which the transmission of current supplied to the light-emitting element LD is controlled. A pulse width of the turn-on period of the emission control signal EMi may vary depending on the operation mode of the display panel DP. In an embodiment, the pulse width of the turn-on period in a relatively low luminance mode where the maximum luminance is relatively low may be adjusted to be wider than the pulse width of the turn-on period in a normal mode where the maximum luminance is relatively high. As a result, a range of grayscales that are represented in the relatively low luminance mode may be expanded. This will be described in detail later.

The seventh transistor T7 may include a first electrode connected to the anode of the light-emitting element LD, a second electrode connected to the second initialization voltage line VL2, and a gate electrode connected to the i-th black gate line GBLi. The seventh transistor T7 may be turned on in response to the black gate signal GBi applied via the i-th black gate line GBLi and may bypass current from the anode of the light-emitting element LD to the second initialization voltage line VL2.

As described above, the one end of the first capacitor C1 may be connected to the gate electrode of the first transistor T1, and an opposite end of the first capacitor C1 may be connected to the first driving voltage line PL1.

One end of the second capacitor C2 may be connected to the one end of the first capacitor C1, and an opposite end of the second capacitor C2 may be connected to the i-th write gate line GWLi.

The anode of the light-emitting element LD may be connected to the second electrode of the sixth transistor T6, and a cathode of the light-emitting element LD may be connected to the second driving voltage line PL2 that transmits the second driving voltage ELVSS.

The circuit configuration of the pixel PXij should not be limited to the circuit configuration shown in FIG. 3. In an embodiment, the number of transistors and the number of capacitors included in the pixel circuit PXC of the pixel PXij and the connection structure of the transistors and the capacitors may be changed in various ways.

Figure 4:
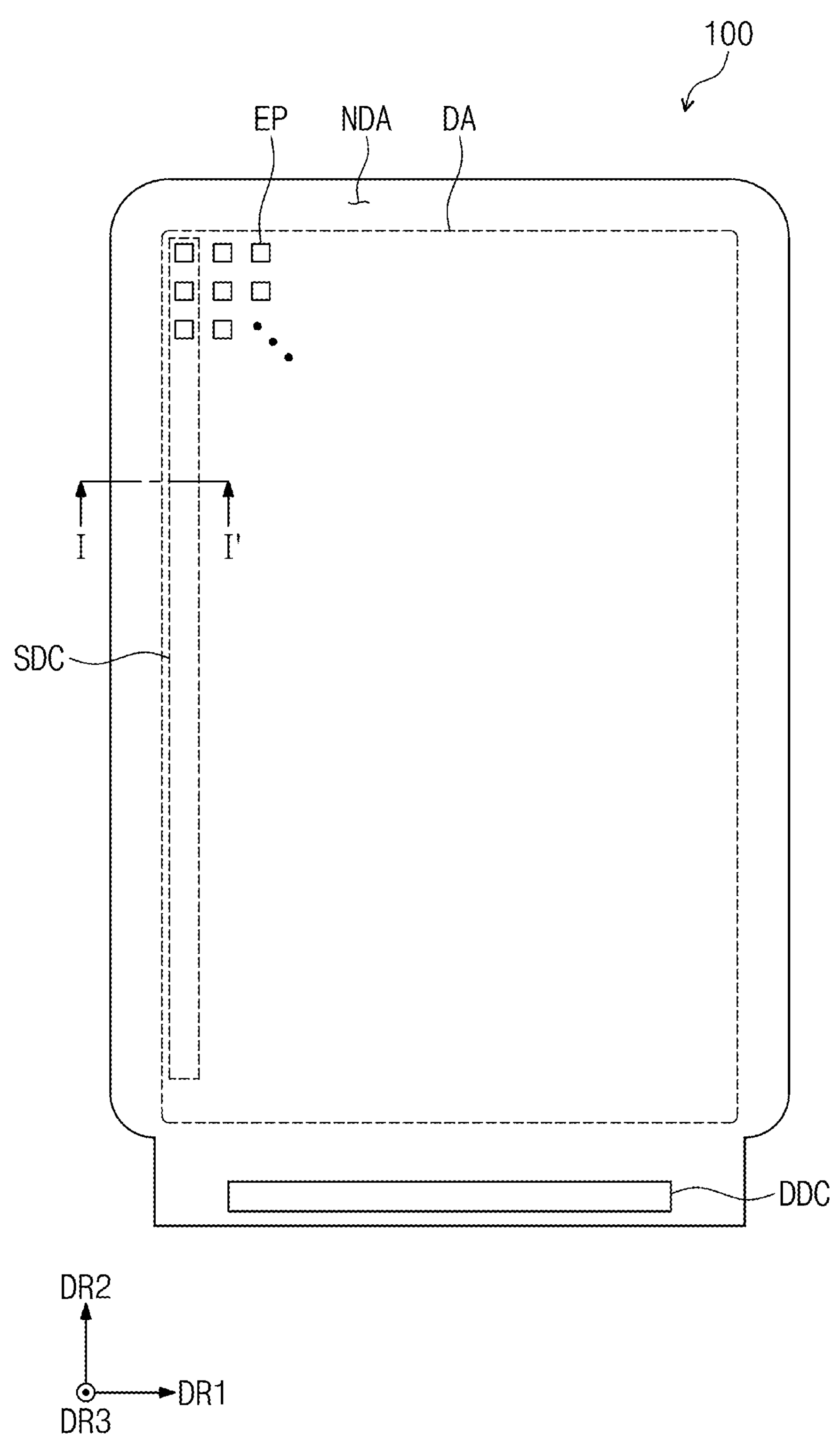
FIG. 4 is a plan view of an embodiment of a display panel according to the disclosure.

FIG. 4 is a plan view of an embodiment of the display panel according to the disclosure. In FIG. 4, some components are omitted.

Referring to FIG. 4, the display panel DP may include the display area DA and the peripheral area (or a non-display area) NDA. The display area DA may include a plurality of light-emitting portions EP. The light-emitting portions EP may be areas from which lights are emitted by the pixels PXij (refer to FIG. 3). In detail, each of the light-emitting portions EP may correspond to a light-emitting opening.

The peripheral area NDA may be defined next (adjacent) to the display area DA. In the illustrated embodiment, the peripheral area NDA may have a shape surrounding an edge of the display area DA. However, this is merely one of embodiments, and the peripheral area NDA may be defined next (adjacent) to one side of the display area DA or may be omitted.

In the illustrated embodiment, a scan driving circuit SDC and a data driving circuit DDC may be disposed (e.g., mounted) on the display panel DP. The scan driving circuit SDC may be disposed in the display area DA, and the data driving circuit DDC may be disposed in the peripheral area NDA. The scan driving circuit SDC may overlap at least some of the light-emitting portions EP arranged in the display area DA in the plan view. Since the scan driving circuit SDC is disposed in the display area DA, a size of the peripheral area NDA may decrease compared to a conventional display panel where a scan driving circuit is disposed in a peripheral area, and thus, the display device with narrow bezel may be easily implemented.

Different from FIG. 4, the scan driving circuit SDC may be provided as two parts distinguished from each other. The two parts may be spaced apart from each other and may be respectively disposed at left and right sides with respect to a center of the display area DA. In an embodiment, the number of the scan driving circuits SDC may be two or more and is not particularly limited.

FIG. 4 shows the structure in which the data driving circuit DDC is disposed in the peripheral area NDA as an illustrative embodiment, however, the disclosure should not be limited thereto or thereby. In an embodiment, the data driving circuit DDC may be disposed in the display area DA. In this case, some of the light-emitting portions EP arranged in the display area DA may overlap the data driving circuit DDC in the plan view.

The data driving circuit DDC may be provided as a separate driving chip independent from the display panel DP and may be connected to the display panel DP. However, this is merely one of embodiments, and the data driving circuit DDC may be formed through the same processes as the scan driving circuit SDC to form the display panel DP, and the disclosure should not be particularly limited.

Figure 5:
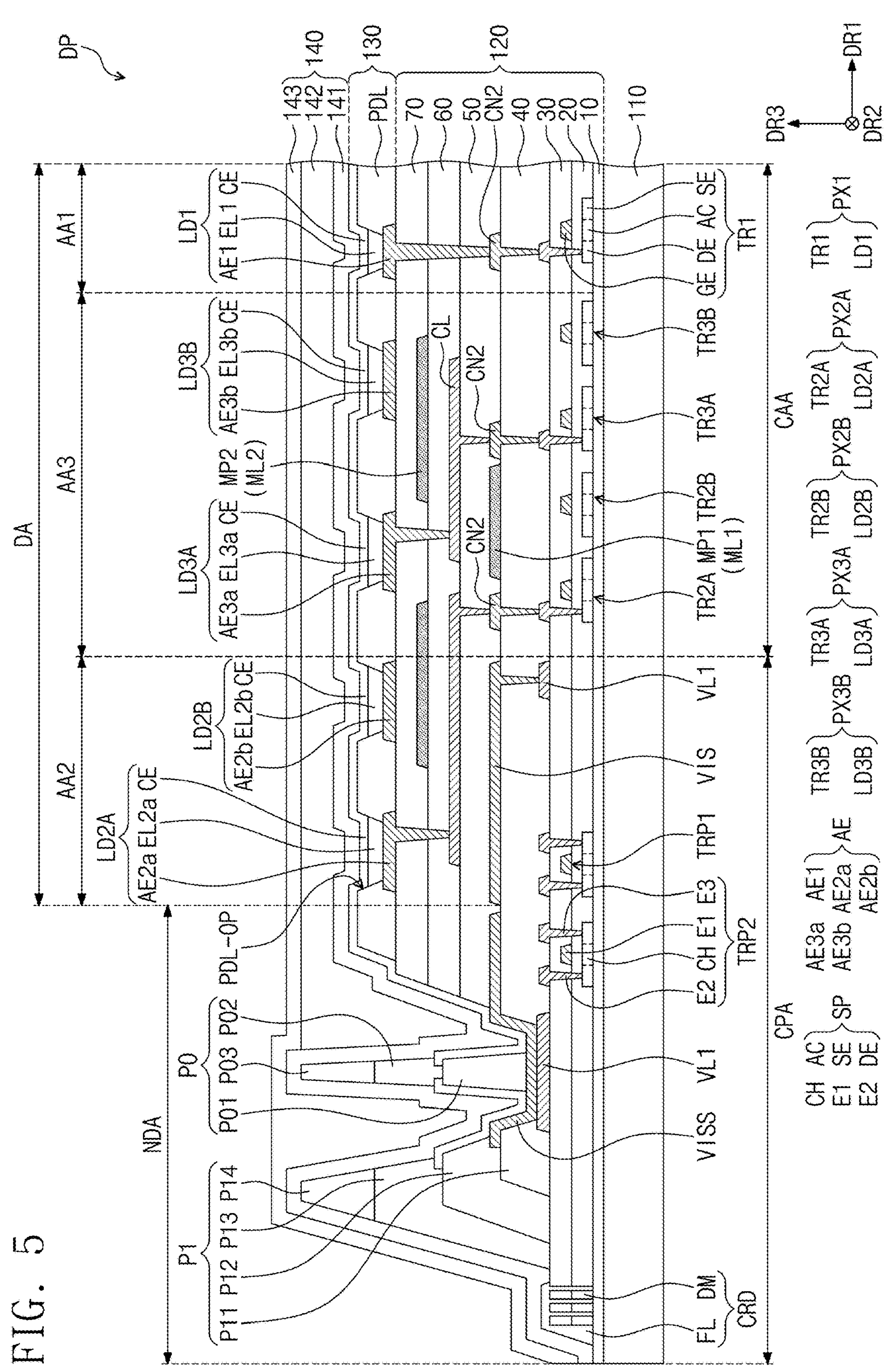
FIG. 5 is a cross-sectional view of an embodiment of a display panel according to the disclosure.

FIG. 5 is a cross-sectional view of an embodiment of the display panel according to the disclosure.

Referring to FIG. 5, the display panel DP may include a base layer 110, a circuit layer 120, a light-emitting element layer 130, and an encapsulation layer 140.

The base layer 110 may be a member that provides a base surface on which the circuit layer 120 is disposed. The base layer 110 may be a rigid substrate or may be a flexible substrate that is bendable, foldable, or rollable. The base layer 110 may be a glass substrate, a metal substrate, or a polymer substrate, however, it should not be limited thereto or thereby. In an embodiment, the base layer 110 may be an inorganic layer, an organic layer, or a composite material layer.

The base layer 110 may have a multi-layer structure. In an embodiment, the base layer 110 may include a first synthetic resin layer, an intermediate layer having a single-layer or multi-layer structure, and a second synthetic resin layer disposed on the intermediate layer, for example. The intermediate layer may be also referred to as a base barrier layer. The intermediate layer may include a silicon oxide (SiOx) layer and an amorphous silicon (a-Si) layer disposed on the silicon oxide layer, however, it should not be particularly limited. In an embodiment, the intermediate layer may include at least one of a silicon oxide layer, a silicon nitride layer, a silicon oxynitride layer, and an amorphous silicon layer.

Each of the first and second synthetic resin layers may include a polyimide-based resin. In addition, each of the first and second synthetic resin layers may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. In the disclosure, the term "X-based resin", as used herein, refers to the resin that includes a functional group of X.

The base layer 110 may include the display area DA and the peripheral area NDA in the plan view. The display area DA may include a first area AA1, a second area AA2, and a third area AA3. The second area AA2 may be spaced apart from the first area AA1 in the first direction. The third area AA3 may be defined between the first area AA1 and the second area AA2 and may overlap a portion of a pixel circuit area CAA. As described above, the display area DA may be the area through which the image is displayed, and the peripheral area NDA may be the area next (adjacent) to the display area DA. A plurality of light-emitting elements LD1, LD2A, LD2B, LD3A, and LD3B respectively included in pixels PX1, PX2A, PX2B, PX3A, and PX3B may be arranged in the display area DA.

The circuit layer 120 may be disposed on the base layer 110. The circuit layer 120 may include an insulating layer, a semiconductor pattern, a conductive pattern, and a signal line. An insulating layer, a semiconductor layer, and a conductive layer may be formed by a coating or depositing process, and the insulating layer, the semiconductor layer, and the conductive layer may be selectively patterned by several photolithography processes. Thus, the semiconductor pattern, the conductive pattern, and the signal line included in the circuit layer 120 may be formed.

The circuit layer 120 may include a plurality of insulating layers 10, 20, 30, 40, and 50, a first conductive layer ML1, a second conductive layer ML2, a pixel driver, and a driving circuit. The circuit layer 120 may include the pixel circuit area CAA and a driving circuit area CPA. The pixel circuit area CAA may be defined in the display area DA, and the driving circuit area CPA may be defined to overlap a portion of the display area DA and the peripheral area NDA. The pixel circuit area CAA and the driving circuit area CPA may be distinguished from each other depending on arrangements of components disposed under the light-emitting elements LD1, LD2A, LD2B, LD3A, and LD3B, i.e., the arrangement of the circuit layer 120.

In detail, a plurality of pixel drivers forming the pixels PX1, PX2A, PX2B, PX3A, and PX3B may be arranged in the pixel circuit area CAA. FIG. 5 shows five pixel transistors TR1, TR2A, TR2B, TR3A, and TR3B of the pixel drivers. The five pixel transistors TR1, TR2A, TR2B, TR3A, and TR3B may be respectively connected to five light-emitting elements LD1, LD2A, LD2B, LD3A, and LD3B distinguished from each other.

In an embodiment, the five light-emitting elements LD1, LD2A, LD2B, LD3A, and LD3B may include a first group of light-emitting elements arranged in the second area AA2 and the third area AA3 and a second group of light-emitting elements arranged in the first area AA1. FIG. 5 shows second light-emitting elements LD2A and LD2B arranged in the second area AA2 and third light-emitting elements LD3A and LD3B arranged in the third area AA3 among the first group of light-emitting elements and a first light-emitting element LD1 among the second group of light-emitting elements as an illustrative embodiment.

The pixel transistors TR1, TR2A, TR2B, TR3A, and TR3B may include a first pixel transistor TR1 disposed in the first area AA1 and second pixel transistors TR2A and TR2B, and third pixel transistors TR3A and TR3B arranged in the third area AA3. Each of the light-emitting elements LD1, LD2A, LD2B, LD3A, and LD3B will be described in detail later.

The driving circuit area CPA may be an area where the driving circuit is disposed. In this case, the driving circuit may be spaced apart from the first area AA1, may be disposed in the second area AA2, and may apply an electrical signal to each of the pixel drivers.

In the illustrated embodiment, a first insulating layer 10 may be disposed on the base layer 110. The pixel transistors TR1, TR2A, TR2B, TR3A, and TR3B may be arranged on the first insulating layer 10.

The first insulating layer 10 may include a barrier layer and a buffer layer. Each of the barrier layer and the buffer layer may be an inorganic layer. However, this is merely one of embodiments, and the first insulating layer 10 may be a single layer, may include multiple layers, or may include an organic layer, and it should not be particularly limited.

When the first insulating layer 10 includes the buffer layer, the first insulating layer 10 may prevent metal atoms or impurities from being diffused to the pixel transistors TR1, TR2A, TR2B, TR3A, and TR3B from the base layer 110. In addition, the first insulating layer 10 may control a rate of heat supply during a crystallization process to form the pixel transistors TR1, TR2A, TR2B, TR3A, and TR3B so that the pixel transistors TR1, TR2A, TR2B, TR3A, and TR3B may be uniformly formed.

Each of the pixel transistors TR1, TR2A, TR2B, TR3A, and TR3B may include a semiconductor pattern SP and a control electrode GE. The semiconductor pattern SP may include a semiconductor material such as silicon, metal oxide, etc.

The semiconductor pattern SP may include a channel AC, a source SE, and a drain DE. The channel AC, the source SE, and the drain DE may be portions distinguished from each other in the plan view. The channel AC may have a conductivity lower than the source SE and the drain DE.

In the illustrated embodiment, the source SE and the drain DE may include reduced metals. The source SE and the drain DE may function as a source electrode and a drain electrode of the first pixel transistor TR1, respectively. However, this is merely one of embodiments, and the first pixel transistor TR1 may further include a separate source electrode and a separate drain electrode, which are connected to the source SE and the drain DE, and the disclosure should not be particularly limited.

The control electrode GE may have conductivity. The control electrode GE may be spaced apart from the semiconductor pattern SP, and a second insulating layer 20 may be disposed between the control electrode GE and the semiconductor pattern SP. The control electrode GE may overlap the channel AC of the semiconductor pattern SP in the plan view.

The second insulating layer 20 may be an inorganic layer and may have a single-layer or multi-layer structure.

A third insulating layer 30, a fourth insulating layer 40, a fifth insulating layer 50, a sixth insulating layer 60, and a seventh insulating layer 70 may be sequentially stacked on the pixel transistors TR1, TR2A, TR2B, TR3A, and TR3B. Each of the third, fourth, fifth, sixth, and seventh insulating layers 30, 40, 50, 60, and 70 may include an organic layer or an organic layer and an inorganic layer stacked one on another.

A first connection electrode CN1 may be disposed between the third insulating layer 30 and the fourth insulating layer 40. The first connection electrode CN1 may be provided in plural and may be connected to each of the pixel transistors TR1, TR2A, TR2B, TR3A, and TR3B after penetrating through the third insulating layer 30 and the second insulating layer 20. In the illustrated embodiment, the first connection electrode CN1 may be connected to the drain DE, however, this is merely one of embodiments. In an embodiment, the first connection electrode CN1 may be connected to the source SE and should not be particularly limited.

A second connection electrode CN2 may be disposed between the fourth insulating layer 40 and the fifth insulating layer 50. The second connection electrode CN2 may be provided in plural and may be connected to the first connection electrode CN1 after penetrating through the fourth insulating layer 40. One of the second connection electrodes CN2 may be connected to the first light-emitting element LD1.

In the illustrated embodiment, the pixels PX1, PX2A, PX2B, PX3A, and PX3B may include connection lines CL that respectively connect the light-emitting elements LD1, LD2A, LD2B, LD3A, and LD3B and the pixel transistors TR1, TR2A, TR2B, TR3A, and TR3B. The connection lines CL may be disposed between the fifth insulating layer 50 and the sixth insulating layer 60. The connection lines CL may be disposed between the first conductive layer ML1 and the second conductive layer ML2. The connection lines CL may connect the first and second groups of the light-emitting elements and the pixel drivers, respectively. That is, the connection lines CL may be provided in plural and may be connected to the second connection electrode CN2 after penetrating through the fifth insulating layer 50. The connection lines CL may be connected to the second and third light-emitting elements LD2A, LD2B, LD3A, and LD3B described later, respectively. In this case, each of the connection lines CL may overlap at least one of the light-emitting elements, which does not overlap therewith. That is, each of the connection lines CL may overlap at least one of first electrodes AE1, AE2*a*, AE2*b*, AE3*a*, and AE3*b*, which does not overlap therewith.

In FIG. 5, the connection lines connecting two light-emitting elements LD2B and LD3B among the second and third light-emitting elements LD2A, LD2B, LD3A, and LD3B of the first group of light-emitting elements and the pixel driver are omitted, however, this omission is merely for the sake of facilitating the explanation of the first and second conductive patterns MP1 and MP2, which will be described later.

The first connection electrode CN1, the second connection electrode CN2, and the connection lines CL may include various materials such as metals, transparent conductive oxides, and conductive polymers. In an embodiment, the connection line CL may include a transparent conductive oxide.

The first conductive layer MP1 may be disposed on the fourth insulating layer 40. The first conductive layer ML1 may be disposed between the connection lines CL and the pixel transistors TR1, TR2A, TR2B, TR3A, and TR3B disposed under the connection lines CL. Accordingly, a coupling phenomenon may be prevented from occurring between the connection lines CL and the pixel transistor overlapping the connection lines CL. In detail, the first conductive layer ML1 may be disposed between the connection line CL, which connects the third light-emitting element LD3A and the third pixel transistor TR3A, and second pixel transistor TR2B overlapping the connection line CL and may serve as a shielding layer. In this case, the first conductive layer ML1 may be supplied with a constant voltage. The first conductive layer ML1 may be maintained at a fixed electric potential, and thus, interference from electric fields generated between the connection line CL and the pixel transistor overlapping the connection line CL may be blocked or suppressed. This will be described in detail later.

The second conductive layer ML2 may be disposed on the sixth insulating layer 60. The second conductive layer ML2 may be disposed between the connection line CL and the light-emitting elements LD1, LD2A, LD2B, LD3A, and LD3B disposed above the connection line CL. Therefore, a coupling phenomenon may be prevented from occurring between the connection line CL and the light-emitting elements LD1, LD2A, LD2B, LD3A, and LD3B disposed above the connection line CL. In detail, the second conductive layer ML2 may be disposed between the connection line CL, which connects the third light-emitting element LD3A and the third pixel transistor TR3A, and the first electrode AE3*b* of the third light-emitting element LD3B overlapping the connection line CL and may serve as a shielding layer. In this case, the second conductive layer ML2 may be supplied with a constant voltage. The second conductive layer ML2 may be maintained at a fixed electric potential, and thus, interference from electric fields generated between the connection line CL and the light-emitting element overlapping the connection line CL may be blocked or suppressed. This will be described in detail later.

In a case where the connection line CL overlaps the first electrodes of the light-emitting elements that do not overlap therewith, a coupling phenomenon may occur between the connection line CL and the first electrodes. Accordingly, the current and voltage of the first electrodes may vary, leading to luminance differences among the light-emitting elements LD1, LD2A, LD2B, LD3A, and LD3B, which may degrade the reliability of the electronic device. As the second conductive layer ML2 is disposed between the connection line CL and the first electrode of the light-emitting element overlapping the connection line CL and serves as the shielding layer, the degree of current and voltage variations of the first electrodes may be reduced, and thus, the occurrence of luminance differences among the light-emitting elements LD1, LD2A, LD2B, LD3A, and LD3B may be reduced. Thus, the reliability of the electronic device may be improved.

FIG. 5 shows the structure in which the first conductive layer ML1 includes one first conductive pattern MP1 as an illustrative embodiment, however, this is for the convenience of explanation. Each of the first conductive layer ML1 and the second conductive layer ML2 may include a plurality of first conductive patterns MP1 and a plurality of second conductive patterns MP2.

In an embodiment, the second conductive pattern MP2 may be further disposed on the connection line CL connecting the second light-emitting element LD2A and the pixel driver. In detail, the second conductive pattern MP2 may be disposed between the connection line CL and the first electrode AE2*b* of the second light-emitting element LD2B. That is, the second conductive pattern MP2 may be disposed between the connection line CL connected to the second light-emitting element LD2A and the first electrode AE2*b* of the second light-emitting element LD2B overlapping the connection line CL and may serve as a shielding pattern.

The first conductive patterns MP1 and the second conductive patterns MP2 may be disposed below and above the connection line CL, respectively, and may serve as the shielding pattern to shield the connection line CL from other components. Accordingly, the current and voltage variations of the light-emitting elements LD1, LD2A, LD2B, LD3A, and LD3B and the pixel transistors TR1, TR2A, TR2B, TR3A, and TR3B may be reduced, and thus, the reliability of the electronic device may be improved.

The light-emitting element layer 130 may be disposed on the circuit layer 120. The light-emitting element layer 130 may include the light-emitting elements LD1, LD2A, LD2B, LD3A, and LD3B. The light-emitting elements LD1, LD2A, LD2B, LD3A, and LD3B may be disposed on the sixth insulating layer 60. The light-emitting elements LD1, LD2A, LD2B, LD3A, and LD3B may be electrically connected to corresponding pixel transistors TR1, TR2A, TR2B, TR3A, and TR3B via the connection electrodes CN1 and CN2 and the connection lines CL (some not shown).

The light-emitting elements may include the first light-emitting element LD1 disposed in the first area AA1, the second light-emitting elements LD2A and LD2B arranged in the second area AA2, and the third light-emitting elements LD3A and LD3B arranged in the third area AA3. In the illustrated embodiment, one first light-emitting element LD1, two second light-emitting elements LD2A and LD2B, and two third light-emitting elements LD3A and LD3B are shown and described as an illustrative embodiment.

The first light-emitting element LD1 may be connected to the first pixel transistor TR1 to form a first pixel PX1. That is, the first pixel PX1 may include a light-emitting element and a first pixel driver, which are arranged in the same area. The first pixel transistor TR1 may be a part of the first pixel driver.

The second light-emitting elements LD2A and LD2B may be respectively connected to the second pixel transistors TR2A and TR2B to form second pixels PX2A and PX2B. That is, the second pixels PX2A and PX2B may include a light-emitting element and a pixel driver, which are arranged in different areas from each other. The second pixel transistors TR2A and TR2B may be spaced apart from components TRP2, TRP1, VIS, and VL1 of the driving circuit arranged in the second area AA2 and may be arranged in the third area AA3. Accordingly, the pixel driver may be disposed in an area that does not interfere with the driving circuit disposed in the driving circuit area CPA, and the second light-emitting elements LD2A and LD2B, which overlap the driving circuit area CPA, may stably emit light without interfering with the driving circuit.

The third light-emitting elements LD3A and LD3B may be respectively connected to the third pixel transistors TR3A and TR3B to form a third pixel PX3. The third pixel PX3 may include a light-emitting element and a pixel driver, which are arranged in the same area, e.g., the third area AA3. However, the third light-emitting elements LD3A and LD3B and the third pixel transistors TR3A and TR3B connected to the third light-emitting elements LD3A and LD3B may not overlap each other in the plan view.

The second light-emitting elements LD2A and LD2B and the third light-emitting elements LD3A and LD3B may be connected to corresponding pixel drivers through the connection lines CL. The connection lines CL may be disposed between the light-emitting element and the pixel transistor and may connect the light-emitting element and the pixel transistor corresponding to the light-emitting element. In the illustrated embodiment, the connection lines CL may be disposed between the fifth insulating layer 50 and the sixth insulating layer 60. As the display panel DP further includes the connection lines CL, the transistor and the light-emitting element, which do not overlap each other in the plan view, may be stably connected to each other.

The light-emitting element layer 130 may include an organic light-emitting material, an inorganic light-emitting material, an organic-inorganic light-emitting material, a quantum dot, a quantum rod, a micro-light-emitting diode ("micro-LED"), or a nano-LED.

The first light-emitting element LD1 may include the first electrode AE1, a second electrode CE, and a first light-emitting layer EL1. The first electrode AE1 may be disposed on the sixth insulating layer 60 and may be connected to the second connection electrode CN2 after penetrating through the sixth insulating layer 60.

The first electrode AE1 may include a reflective layer including Ag, Mg, Al, Pt, Pd, Au, Ni, Nd, Ir, Cr, or compounds thereof and a transparent or semi-transparent electrode layer disposed on the reflective layer. The transparent or semi-transparent electrode layer of the first electrode AE1 may include at least one selected from the group including or consisting of indium tin oxide ("ITO"), indium zinc oxide ("IZO"), indium gallium zinc oxide ("IGZO"), zinc oxide (ZnO) or indium oxide (In2O3), and aluminum-doped zinc oxide ("AZO"). In an embodiment, the first electrode AE may include a stack structure of ITO/Ag/ITO, for example.

The first light-emitting layer EL1 may be disposed in one of the light-emitting openings PDL-OP defined through a pixel definition layer PDL. The first light-emitting layer EL1 may include an organic light-emitting material and/or an inorganic light-emitting material. The first light-emitting element LD1 may excite the first light-emitting layer EL1 according to a potential difference between the first electrode AE1 and the second electrode CE to generate a light.

The second electrode CE may be disposed on the pixel definition layer PDL. The second electrode CE may have an integral shape that covers the light-emitting layers. The second electrode CE may be formed over the entirety of the display area DA.

Although not shown in drawing figures, a hole control layer may be disposed between the first electrode AE1 and the first light-emitting layer EL1. The hole control layer may include a hole transport layer and may further include a hole injection layer. An electron control layer may be disposed between the first light-emitting layer EL1 and the second electrode CE. The electron control layer may include an electron transport layer and may further include an electron injection layer. The hole control layer and the electron control layer may be commonly formed over the pixels PXij (refer to FIG. 3) using an open mask.

The first light-emitting element LD1 may be disposed in the first area AA1. In this case, the first area AA1 may be defined in the pixel circuit area CAA.

The first light-emitting element LD1 may be connected to the second connection electrode CN2. The second connection electrode CN2 connected to the first light-emitting element LD1 may be connected to the first connection electrode CN1 disposed in the first area AA1. The first connection electrode CN1 may be connected to the first pixel transistor TR1 disposed in the first area AA1. The first light-emitting element LD1 and the first pixel transistor TR1 may be arranged in the same area. The first light-emitting element LD1 may overlap the first pixel transistor TR1.

The second light-emitting elements LD2A and LD2B may be arranged in the second area AA2. In this case, the second area AA2 may be an area within the display area DA where the light-emitting elements are placed without overlapping the pixel transistors connected to the light-emitting elements. In addition, the second area AA2 may overlap the driving circuit area CPA and particularly may overlap the scan driving circuit SDC (refer to FIG. 4).

Each of the second light-emitting elements LD2A and LD2B may have a structure corresponding to the first light-emitting element LD1. That is, the second light-emitting elements LD2A and LD2B may include the first electrodes AE2*a* and AE2*b*, light-emitting layers EL2*a* and EL2*b*, and the second electrode CE. The first electrodes AE2*a* and AE2*b* and the light-emitting layers EL2*a* and EL2*b* may be arranged in the second area AA2.

The second light-emitting elements LD2A and LD2B may overlap driving transistors TRP1 and TRP2 that form the scan driving circuit SDC in the plan view. Accordingly, the connection line CL may extend from the third area AA3 to the second area AA2 and may connect the second light-emitting elements LD2A and LD2B and the second pixel transistors TR2A and TR2B.

Each of the third light-emitting elements LD3A and LD3B may have a structure corresponding to the first light-emitting element LD1. That is, the third light-emitting elements LD3A and LD3B may include the first electrodes AE3*a* and AE3*b*, light-emitting layer EL3*a* and EL3*b*, and the second electrode CE. However, this is merely one of embodiments, and in an embodiment, the first, second, and third light-emitting elements LD1, LD2A, LD2B, LD3A, and LD3B may have different structures from each other and should not be particularly limited.

The pixel definition layer PDL may be disposed on the seventh insulating layer 70. The light-emitting openings PDL-OP may be defined through the pixel definition layer PDL to expose at least a portion of the first electrodes AE.

In the illustrated embodiment, the pixel definition layer PDL may have a light-absorbing property, e.g., the pixel definition layer PDL may have a black color. The pixel definition layer PDL may include a black coloring agent. The black coloring agent may include a black dye or a black pigment, or may include a metal material, such as carbon black, chromium, or an oxide thereof. The pixel definition layer PDL may include an organic material and/or an inorganic material.

The encapsulation layer 140 may be disposed on the light-emitting element layer 130. The encapsulation layer 140 may protect the light-emitting element layer 130 from moisture, oxygen, and a foreign substance such as dust particles. The encapsulation layer 140 may include an inorganic layer 141, an organic layer 142, and an inorganic layer 143, which are sequentially stacked, however, layers included in the encapsulation layer 140 should not be limited thereto or thereby.

The inorganic layers 141 and 143 may protect the light-emitting element layer 130 from moisture and oxygen, and the organic layer 142 may protect the light-emitting element layer 130 from a foreign substance such as dust particles. The inorganic layers 141 and 143 may include a silicon nitride layer, a silicon oxynitride layer, a silicon oxide layer, a titanium oxide layer, or an aluminum oxide layer. The organic layer 142 may include an acrylic-based organic layer, however, it should not be limited thereto or thereby.

In the driving circuit area CPA, circuit components, such as the scan driving circuit SDC, the first initialization voltage line VL1, a shielding line VIS, etc., other than a pixel circuit part may be arranged.

A portion of the first initialization voltage line VL1 may be disposed in the display area DA and may overlap the second area AA2. The first initialization voltage line VL1 may be connected to the conductive line CL disposed on the fourth insulating layer 40 after penetrating through the fourth insulating layer 40. The first initialization voltage line VL1 may apply an initialization voltage to a pixel driving circuit.

The shielding line VIS may be connected to the first initialization voltage line VL1. The shielding line VIS may electrically shield a second-A light-emitting element LD2A. The shielding line VIS may prevent noises from occurring in the second-A light-emitting element LD2A due to the driving transistors TRP1 and TRP2.

The scan driving circuit SDC and the first initialization voltage line VL1 may be arranged in an area of the driving circuit area CPA, which overlaps the display area DA. In FIG. 5, some driving transistors TRP1 and TRP2 of the scan driving circuit SDC are shown for ease of explanation.

The driving transistor TRP1 may include the semiconductor pattern SP including a channel CH, a control electrode E1, an input electrode E2, and an output electrode E3. The driving transistors TRP1 and TRP2 may be formed through the same process as the pixel transistors TR1, TR2A, TR2B, TR3A, and TR3B. The driving transistors TRP1 and TRP2 may not overlap the pixel transistors TR1, TR2A, TR2B, TR3A, and TR3B in the plan view.

An initialization voltage pattern VISS may be connected to the first initialization voltage line VL1 and may receive the first initialization voltage VINT (refer to FIG. 2).

The display panel DP in the illustrated embodiment may include a plurality of dams P0 and P1 and a crack dam CRD. The dams P0 and P1 may be arranged along an edge of the display area DA in the plan view. The dams P0 and P1 may prevent the organic layer 142 from overflowing. The dams P0 and P1 may include a first dam P0 and a second dam P1.

The first dam P0 may be disposed relatively closer to the display area DA between the dams P0 and P1. The first dam P0 may overlap the first initialization voltage line VL1.

The first dam P0 may include a first layer P01, a second layer P02, and a third layer P03. Each of the first layer P01, the second layer P02, and the third layer P03 may include an insulating material. In the illustrated embodiment, the first layer P01 may include the same material as that of the fifth insulating layer 50, and the second layer P02 and the third layer P03 may include the same material as that of the sixth insulating layer 60 and/or the pixel definition layer PDL.

The second dam P1 may be relatively farther from the display area DA between the dams P0 and P1. In the illustrated embodiment, the second dam P1 may include a first layer P11, a second layer P12, a third layer P13, and a fourth layer P14. In an embodiment, the first layer P11 may include the same material as that of the fourth insulating layer 40, the second layer P12 may include the same material as that of the fifth insulating layer 50, and the third layer P13 and the fourth layer P14 may include the same material as that of the sixth insulating layer 60, the seventh insulating layer 70 and/or the pixel definition layer PDL. The first dam P0 and the second dam P1 may have substantially the same layer structure as each other, and an extra dam may be disposed in the peripheral area NDA in addition to the first dam P0 and the second dam P1, however, the disclosure should not be limited thereto or thereby.

The crack dam CRD may be disposed in the peripheral area NDA and may be disposed at an end of the second insulating layer 20 and the third insulating layer 30. The crack dam CRD may include a dam portion DM and a filling portion FL.

The dam portion DM may include a plurality of insulating patterns arranged spaced apart from the display area DA in a direction toward an edge of the display panel DP. The insulating patterns may include the same material as that of the second insulating layer 20 and the third insulating layer 30 and may be substantially simultaneously formed with the second insulating layer 20 and the third insulating layer 30.

The filling portion FL may include an organic material. The filling portion FL may include a material with relatively high flexibility compared to the dam portion DM. The filling portion FL may cover the dam portion DM and may fill spaces between the insulating patterns.

Figure 6:
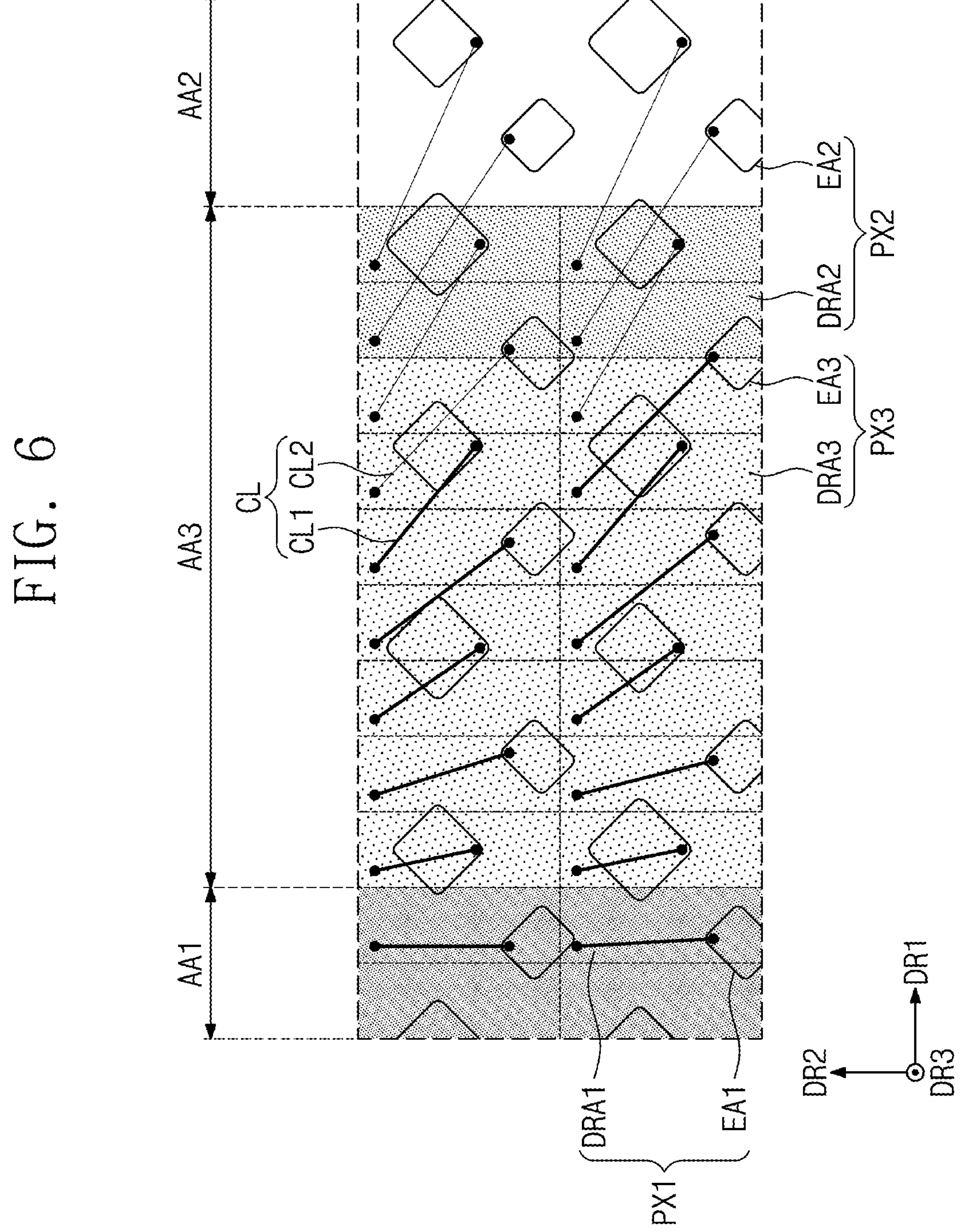
FIG. 6 is a plan view of an embodiment of a display panel according to the disclosure.

FIG. 6 is a plan view of an embodiment of a portion of the display panel according to the disclosure. In FIG. 6, the same/similar reference numerals denote the same/similar elements in FIG. 5, and thus, detailed descriptions of the same elements will be omitted. In FIG. 6, for the convenience of explanation, the connection lines CL are represented by a solid line, and contact portions respectively formed in pixel drivers DRA1, DRA2, and DRA3 and light-emitting areas EA1, EA2, and EA3 are represented by dots.

Referring to FIG. 6, the display panel may include the first pixel PX1, a second pixel PX2, and the third pixel PX3. The first pixel PX1 may include a light-emitting element disposed in the first light-emitting area EA1 and a first pixel driver DRA1 disposed in the first area AA1, the second pixel PX2 may include a light-emitting element disposed in the second light-emitting area EA2 and a second pixel driver DRA2 disposed in the third area AA3, and the third pixel PX3 may include a light-emitting element disposed in the third light-emitting area EA3 and a third pixel driver DRA3 disposed in the third area AA3. For the convenience of explanation, the first, second, and third pixel drivers DRA1, DRA2, and DRA3 are shaded differently to be distinguished from each other.

The light-emitting areas EA1, EA2, and EA3 may be defined in the first, second, and third areas AA1, AA2, and AA3, respectively. The light-emitting areas EA1, EA2, and EA3 may be areas that emit lights. Each of the light-emitting areas EA1, EA2, and EA3 may be defined by the light-emitting opening PDL-OP (refer to FIG. 5). The light-emitting areas EA1, EA2, and EA3 may include a first light-emitting area EA1 defined in the first area AA1, a second light-emitting area EA2 defined in the second area AA2, and a third light-emitting area EA3 defined in the third area AA3. In this case, the first, second, and third areas AA1, AA2, and AA3 may correspond to the first, second, and third areas AA1, AA2, and AA3 of FIG. 5, respectively.

The pixel drivers DRA1, DRA2, and DRA3 may be arranged in the first and second areas AA1 and AA3 and may not be arranged in the third area AA2. The pixel drivers DRA1, DRA2, and DRA3 may include the first pixel driver DRA1 arranged in the first area AA1 and the second and third pixel drivers DRA2 and DRA3 arranged in the third area AA3.

The connection lines CL may connect the light-emitting elements respectively arranged in the light-emitting areas EA1, EA2, and EA3 and the pixel drivers DRA1, DRA2, and DRA3, respectively. The connection lines CL may be disposed between the light-emitting elements respectively arranged in the light-emitting areas EA1, EA2, and EA3 and the pixel drivers DRA1, DRA2, and DRA3.

Positions of the pixel drivers DRA1, DRA2, and DRA3 with respect to the light-emitting areas EA1, EA2, and EA3 may be varied. In an embodiment, distances between the pixel drivers DRA1, DRA2, and DRA3 and the first electrodes AE (refer to FIG. 5) respectively corresponding to the pixel drivers DRA1, DRA2, and DRA3 may gradually increase along the first direction DR1. In this case, the first direction DR1 may be a direction approaching the second area AA2.

In detail, the connection lines CL may have different lengths. In an embodiment, among the connection lines CL connected to the pixel drivers DRA1, DRA2, and DRA3 arranged in the third area AA3, each of connection lines CL2 (hereinafter, also referred to as second connection lines) connected to the light-emitting elements arranged in the second area AA2 or the light-emitting area next (adjacent) to the second area AA2 may have a length greater than a length of each of connection lines CL1 (hereinafter, also referred to as first connection lines) connected to the light-emitting elements arranged in the light-emitting area next (adjacent) to the first area AA1.

Referring to FIG. 6, each of the first connection lines CL1 may have a width different from a width of each of the second connection lines CL2 in the plan view. In FIG. 6, the widths of the first connection lines CL1 are shown as being equal to one another, and the widths of the second connection lines CL2 are shown as being equal to one another. However, this is for ease of explanation, and the disclosure should not be limited thereto or thereby. In an embodiment, as the connection lines CL are placed closer to the second area AA2, the width of the connection lines CL may be sequentially reduced. That is, the connection lines CL arranged in the second and third areas AA2 and AA3 among the connection lines CL may have the width smaller than the width of the connection lines CL arranged in the first area AA1 among the connection lines CL. When the connection line CL is designed to have a smaller width as its length increases, the area of each connection line CL may be substantially equal in the plan view. In this case, the area of the connection line CL may be defined as the product of its length and its width.

As described above, the length of each of the second connection lines CL2 may be greater than the length of each of the first connection lines CL1. Accordingly, when the widths of all the connection lines CL are designed to be the same, the area of each of the second connection lines CL2 may be greater than the area of each of the first connection lines CL1. As the area of the connection line CL becomes larger, a capacitance value between the connection line CL and the first electrode AE of the light-emitting element connected to the connection line CL may increase. That is, capacitances (hereinafter, also referred to as anode capacitances) between the connection lines CL and the first electrodes AE next (adjacent) to the connection lines CL may increase along the first direction DR1. Since each of the light-emitting elements may have a different anode capacitance value, when the same anode initialization voltage is applied to the light-emitting elements, there may be differences in the amount of charge that is initialized, and slight variations may occur in the capacitance value of the light-emitting elements. Accordingly, differences in luminance among the light-emitting elements may cause a decrease in the reliability of the electronic device.

As described above, when the connection line CL is designed to have a smaller width as its length increases, the area of each connection line CL may be substantially equal in the plan view. That is, the light-emitting elements may have uniform anode capacitance values. In this case, the uniform anode capacitance value may refer to an anode capacitance value within an error range. Since the light-emitting elements have the uniform anode capacitance value, the degree of luminance difference among the light-emitting elements may be reduced. Accordingly, the reliability of the electronic device may be improved.

Figure 7:
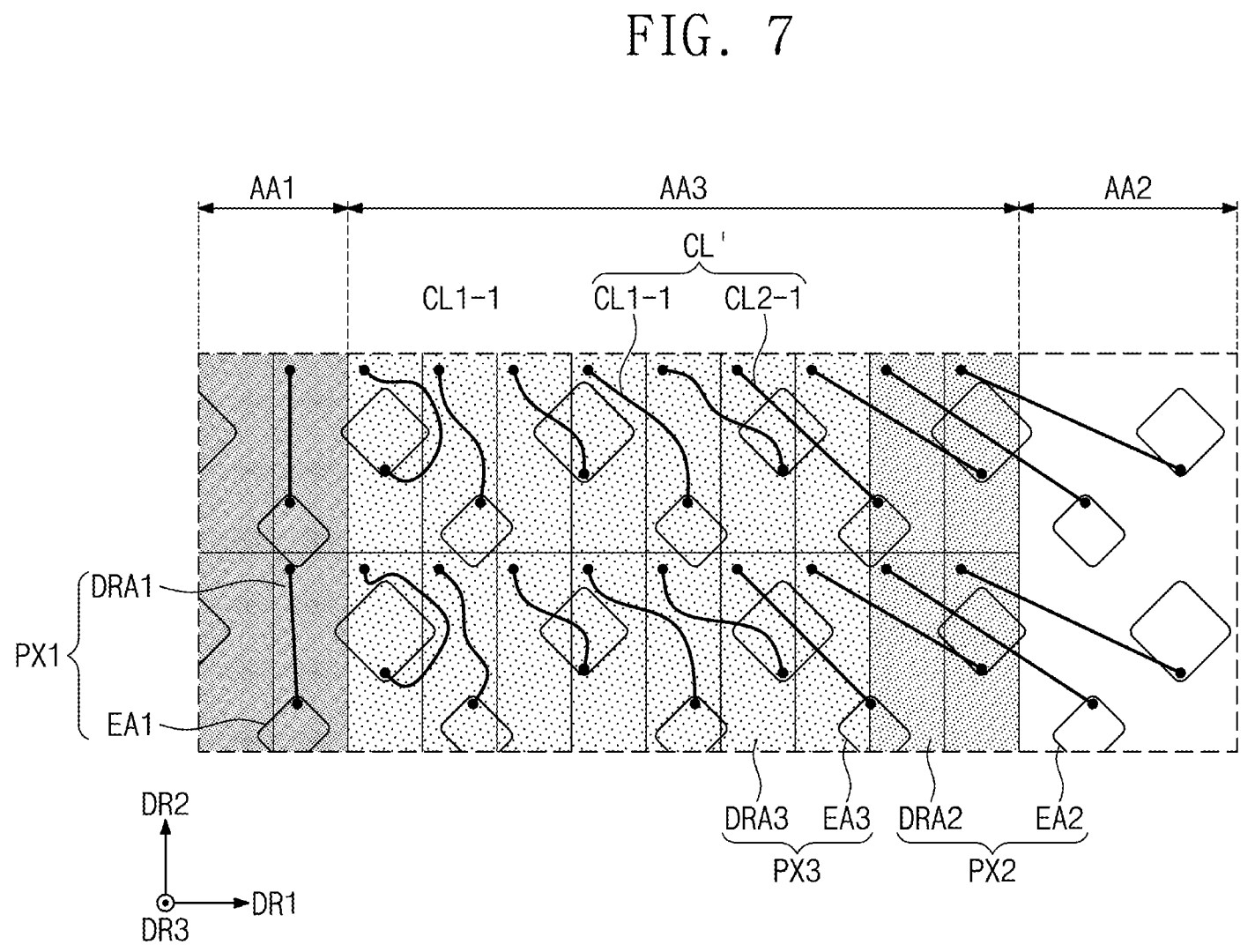

FIG. 7 is a plan view of an embodiment of a portion of a display panel according to the disclosure. In FIG. 7, the same/similar reference numerals denote the same/similar elements in FIGS. 5 and 6, and thus, detailed descriptions of the same elements will be omitted.

Referring to FIG. 7, each of first connection lines CL1 may include a curved portion. In detail, among connection lines CL', each of connection lines CL' arranged in a third area AA3 and next (adjacent) to a first area AA1 may include the curved portion in the plan view.

When the first connection lines CL1 include the curved portion, a length of the first connection lines CL1 may increase compared to the connection lines having a straight line shape. That is, different from the embodiment described with reference to FIG. 6, since the first connection lines CL1 shown in FIG. 7 are designed to be connected to first electrodes AE and a pixel driver through a non-straight path, the length of each connection lines CL1 may increase.

Different from the first connection lines CL1, second connection lines CL2 may have the straight line shape in the plan view. That is, the second connection lines CL2 may be connected to the first electrodes AE and the pixel driver through a straight path.

That is, by increasing the length of each of the first connection lines CL1 to be similar to a length of each of the second connection lines CL2, the area of each of the connection lines CL' may become substantially identical in the plan view. In this case, each of the first connection lines CL1 may have the same width as a width of each of the second connection lines CL2 in the plan view. Light-emitting elements may have uniform anode capacitance values. In this case, the uniform anode capacitance value may refer to an anode capacitance value within an error range. Since the light-emitting elements have the uniform anode capacitance value, the degree of luminance difference among the light-emitting elements may be reduced. Accordingly, the reliability of the electronic device may be improved.

FIG. 7 shows that only the connection lines CL1 arranged in the third area AA3 and next (adjacent) to the first area AA1 among the connection lines CL' include the curved portion in the plan view, however, this is merely one of embodiments. In an embodiment, the connection lines CL' arranged in the first area AA1 may also include the curved portion. The shape of each of the connection lines CL' may be changed in various ways and should not be particularly limited.

Figure 8:
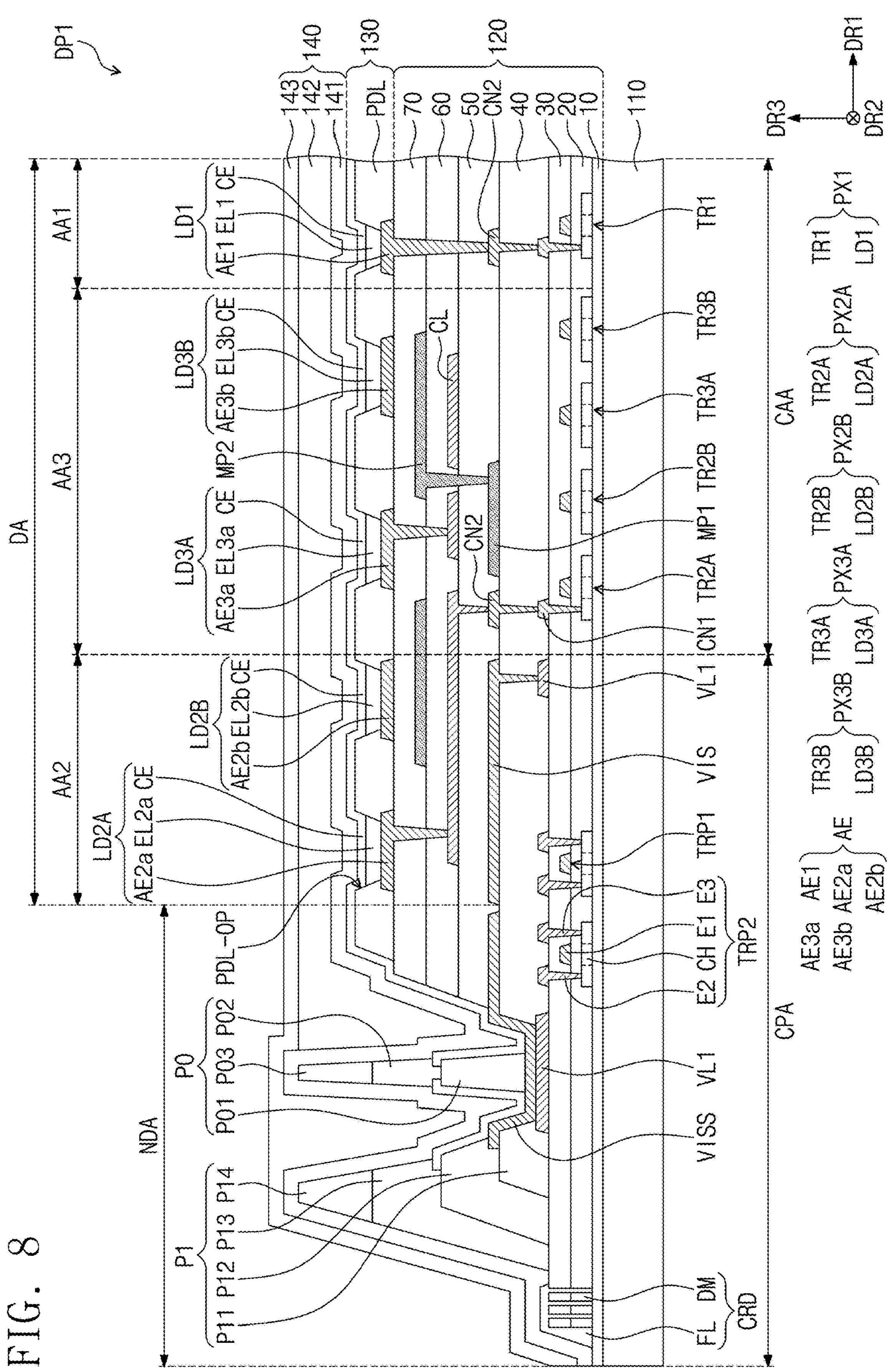
FIG. 8 is a cross-sectional view of an embodiment of a display panel according to the disclosure.

FIG. 8 is a cross-sectional view of an embodiment of a display panel according to the disclosure. In FIG. 8, the same/similar reference numerals denote the same/similar elements in FIGS. 5 to 7, and thus, detailed descriptions of the same elements will be omitted.

Referring to FIG. 8, in a display panel DP1, a first conductive pattern MP1 and a second conductive pattern MP2 may be connected to each other. The first conductive pattern MP1 may be connected to the second conductive pattern MP2 via a contact portion penetrating through at least one insulating layer. Different from the embodiment described with reference to FIG. 5, in the illustrated embodiment, the first conductive pattern MP1 and the second conductive pattern MP2 may be connected to each other and may receive the same constant voltage through the same line. Accordingly, the first conductive pattern MP1 and the second conductive pattern MP2 may be at the same electric potential state and thus may serve as electrical shielding patterns. The first conductive pattern MP1 may be maintained at a fixed electric potential and may block or suppress interference from electric fields generated between a connection line CL and a pixel transistor overlapping the connection line CL. The second conductive pattern MP2 may be maintained at the fixed electric potential and may block or suppress interference from electric fields generated between the connection line CL and a light-emitting element overlapping the connection line CL.

The same constant voltage may be applied to the first and second conductive patterns MP1 and MP2 through a single line. As the first and second conductive patterns MP1 and MP2 for the shielding function are controlled through one signal line, a circuit design may be simplified. In addition, since the same constant voltage may be applied to each of the first and second conductive patterns MP1 and MP2 while remaining stable, a shielding effect of suppressing external noise may be more uniformly applied.

Figure 9:
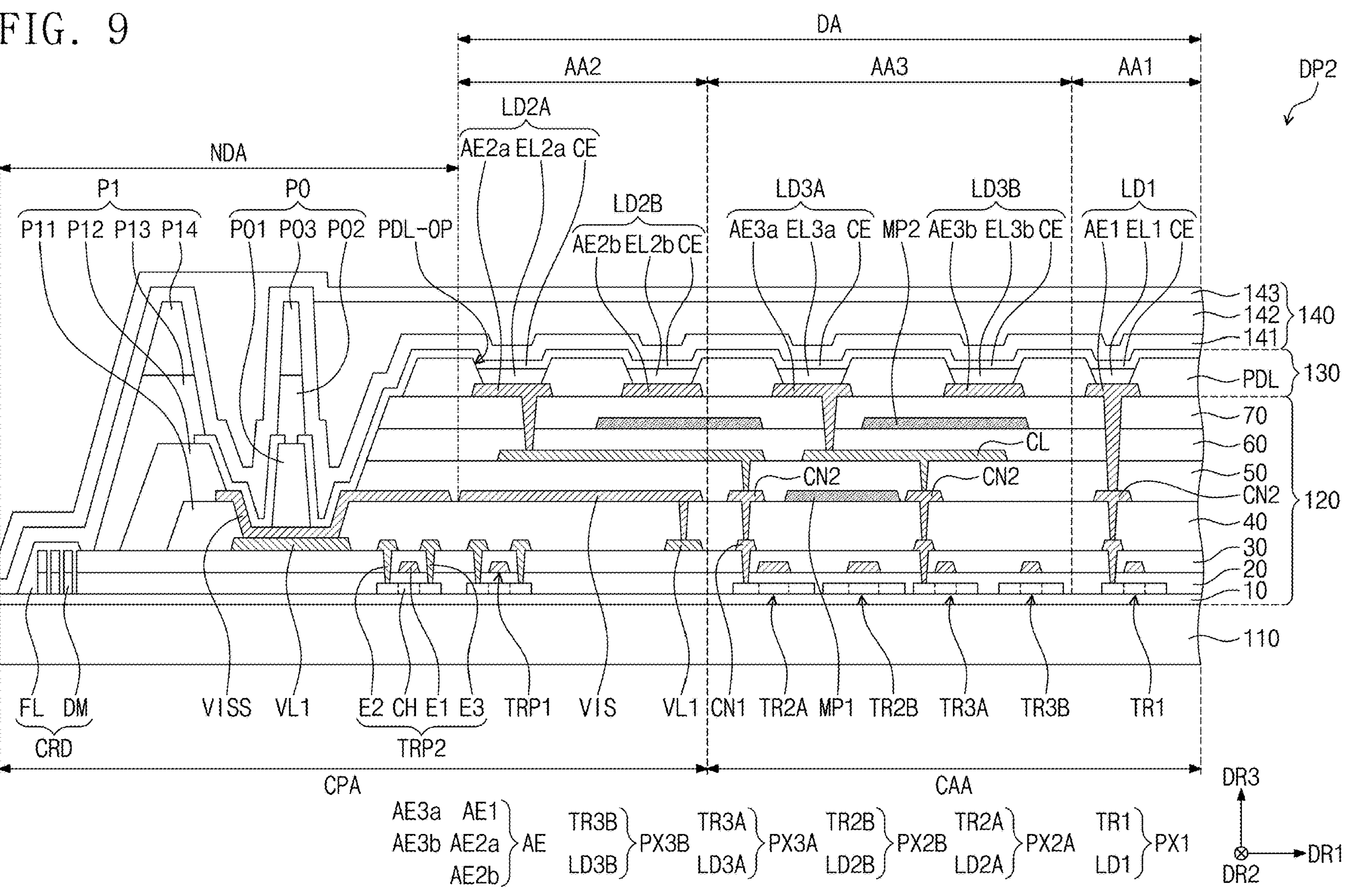
FIG. 9 is a cross-sectional view of an embodiment of a display panel according to the disclosure.

FIG. 9 is a cross-sectional view of an embodiment of a display panel according to the disclosure. In FIG. 9, the same/similar reference numerals denote the same/similar elements in FIGS. 5 to 8, and thus, detailed descriptions of the same elements will be omitted.

Referring to FIG. 9, in a display panel DP2, pixel transistors TR1, TR2A, TR2B, TR3A, and TR3B may have different sizes. In detail, the pixel transistors TR1, TR2A, TR2B, TR3A, and TR3B may be larger in size as they are closer to the second area AA2. In this case, the size of the pixel transistor may refer to a width of an active layer of the pixel transistor when viewed in a cross-section. In an embodiment, among the pixel transistors arranged in a third area AA3, the width of the active layer of the pixel transistor next (adjacent) to a second area AA2 may be greater than the width of the active layer of the pixel transistor next (adjacent) to a first area AA1 when viewed in the cross-section. In addition, the width of the active layer of the pixel transistor disposed the third area AA3 may be greater than the width of the active layer of the pixel transistor disposed in the first area AA1 when viewed in the cross-section.

Referring to FIG. 9, second pixel transistors TR2A and TR2B, third pixel transistors TR3A and TR3B, and a first pixel transistor TR1 may have active layers of different widths. The width of the active layer of each of the second pixel transistors TR2A and TR2B may be greater than the width of the active layer of each of the third pixel transistors TR3A and TR3B and the first pixel transistor TR1, however, the disclosure should not be limited thereto or thereby. In an embodiment, when viewed in the cross-section, the active layers of the second pixel transistors TR2A and TR2B, the third pixel transistors TR3A and TR3B, and the first pixel transistor TR1 may have different widths from each other, and the pixel transistors may be larger in size as they are closer to the second area AA2, however, the disclosure should not be limited thereto or thereby.

As described above, the connection line CL disposed closer to the second area AA2 may have a relatively larger length compared to the length of the connection line CL disposed farther away from the second area AA2. When the length of the connection line CL increases, an amount of current reaching a light-emitting element connected to the connection line CL may be reduced, and a luminance value of the light-emitting element may be reduced. When the width of the active layer of the pixel transistor is designed to be relatively large, an on-resistance of the pixel transistor may be reduced. Accordingly, a larger current may flow even when the same voltage is applied to the pixel transistor, and a larger amount of current may be supplied to the light-emitting element. That is, as the width of the active layer of the pixel transistor placed closer to the second area AA2 is designed to be the relatively large, the current reaching the light-emitting element connected to the pixel transistor may increase, and the luminance of the light-emitting element may be compensated.

Figure 10:
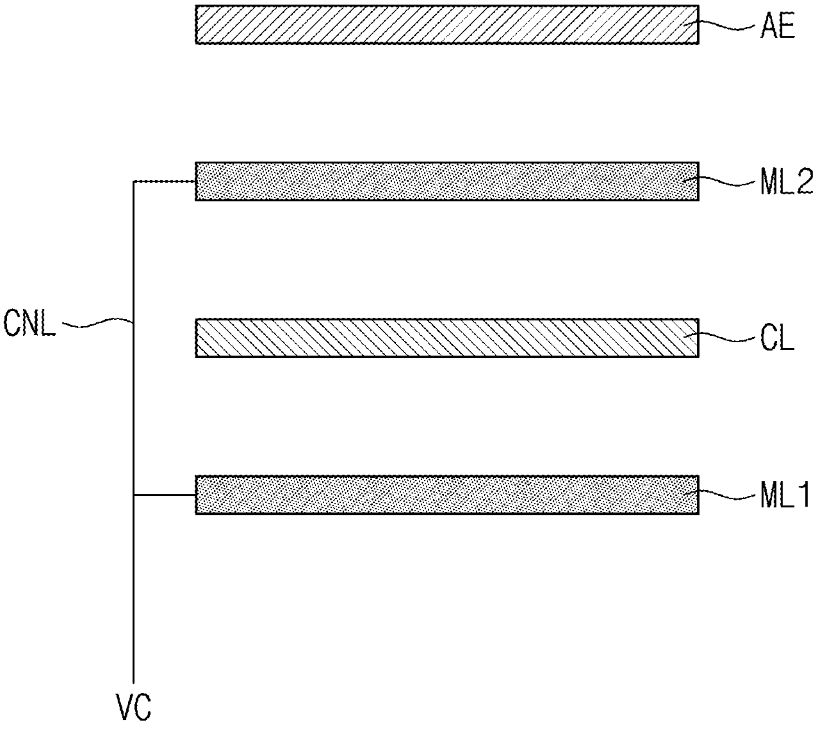
FIG. 10 is a schematic diagram illustrating an embodiment of a connection structure between components of an electronic device according to the disclosure.

FIG. 10 is a schematic diagram illustrating an embodiment of a connection structure between components of an electronic device according to the disclosure. In FIG. 10, the same/similar reference numerals denote the same/similar elements in FIGS. 5 to 9, and thus, detailed descriptions of the same elements will be omitted.

Referring to FIG. 10, a first conductive layer ML1 may receive a constant voltage VC through a constant voltage line CNL. A second conductive layer ML2 may receive the constant voltage VC through the constant voltage line CNL. That is, the first conductive layer ML1 and the second conductive layer ML2 may receive the constant voltage VC through the same constant voltage line CNL. The first conductive layer ML1 and the second conductive layer ML2 may receive the constant voltage VC with the same voltage level.

The constant voltage line CNL may be one of the first initialization voltage line VL1 (refer to FIG. 3), the second initialization voltage line VL2 (refer to FIG. 3), the first driving voltage line PL1 (refer to FIG. 3), and the second driving voltage line PL2 (refer to FIG. 3). In this case, the constant voltage VC may be one of the first driving voltage ELVDD (refer to FIG. 3), the second driving voltage ELVSS (refer to FIG. 3), the first initialization voltage VINT (refer to FIG. 3), and the second initialization voltage AINT (refer to FIG. 3). As one of the lines VL1, VL2, PL1, and PL2 used to drive the light-emitting element is used as the constant voltage line CNL, the constant voltage may be applied to each of the first and second conductive layers ML1 and ML2 without additional processes, and thus, the cost and time desired for the processes may be reduced.

Figure 11:
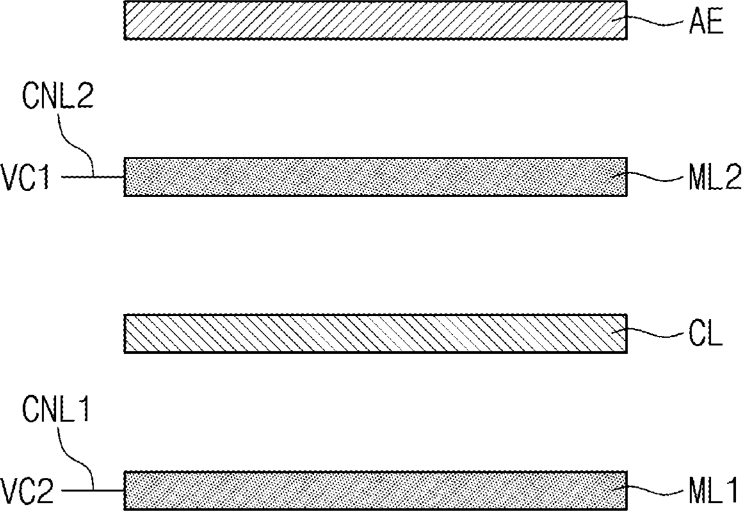
FIG. 11 is a schematic diagram illustrating an embodiment of a connection structure between components of an electronic device according to the disclosure.

FIG. 11 is a schematic diagram illustrating an embodiment of a connection structure between components of an electronic device according to the disclosure. In FIG. 11, the same/similar reference numerals denote the same/similar elements in FIGS. 5 to 10, and thus, detailed descriptions of the same elements will be omitted.

Referring to FIG. 11, a first conductive layer ML1 may receive a first constant voltage VC1 through a first constant voltage line CNL1. A second conductive layer ML2 may receive a second constant voltage VC2 through a second constant voltage line CNL2. That is, the first conductive layer ML1 and the second conductive layer ML2 may receive the constant voltages VC1 and VC2 through different constant voltage lines CNL1 and CNL2, respectively. In this case, the first conductive layer ML1 and the second conductive layer ML2 may receive the constant voltages VC1 and VC2 having different levels, however, the disclosure should not be limited thereto or thereby. In an embodiment, the first conductive layer ML1 and the second conductive layer ML2 may receive the constant voltages VC1 and VC2 having the same level through different constant voltage lines CNL1 and CNL2.

Each of the first constant voltage line CNL1 and the second constant voltage line CNL2 may be a line different from the first initialization voltage line VL1 (refer to FIG. 3), the second initialization voltage line VL2 (refer to FIG. 3), the first driving voltage line PL1 (refer to FIG. 3), and the second driving voltage line PL2 (refer to FIG. 3). In this case, the constant voltage may be one of the first driving voltage ELVDD, the second driving voltage ELVSS, the first initialization voltage VINT, and the second initialization voltage AINT. When an extra line is added to the lines used to drive the light-emitting element, each of the constant voltages VC1 and VC2 of the first and second conductive layers ML1 and ML2 may be controlled independently of the light-emitting element. Accordingly, interference with the light-emitting element driving voltage to the first and second conductive layers ML1 and ML2 may be reduced, allowing for more flexible adjustment of the voltage of each line. When the first and second constant voltages VC1 and VC2 are independently controlled, the voltage variation of the light-emitting element may be reduced, and thus, the luminance of the light-emitting element may be more uniform.

Figure 12A:
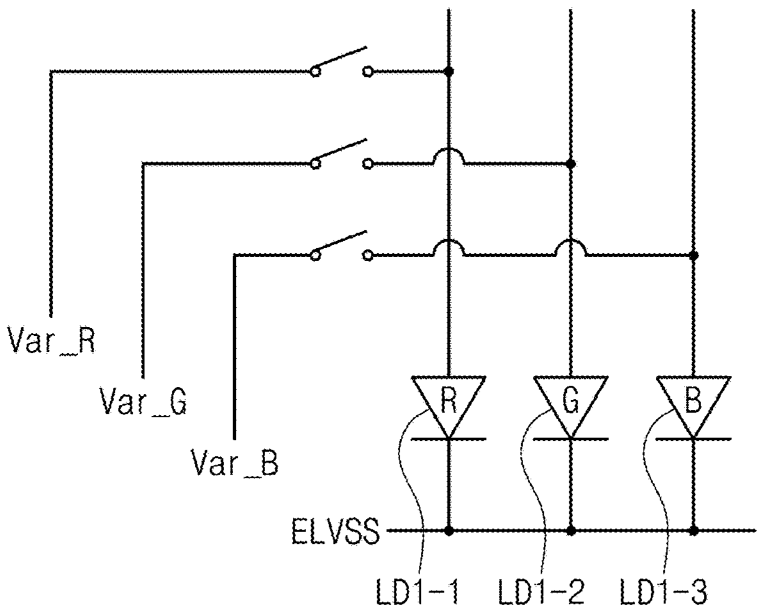
FIGS. 12A and 12B are circuit diagram of embodiments according to the disclosure.
Figure 12B:
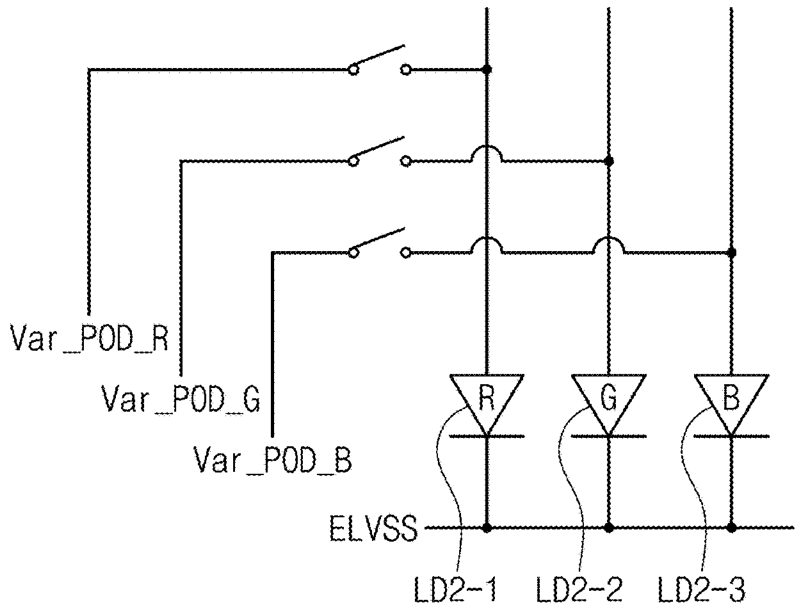

FIGS. 12A and 12B are circuit diagrams of embodiments according to the disclosure. In FIG. 12, the same/similar reference numerals denote the same/similar elements in FIGS. 5 to 11, and thus, detailed descriptions of the same elements will be omitted. FIG. 12A is a circuit diagram illustrating an anode initialization voltage applied to light-emitting elements LD1-1, LD1-2, and LD1-3 arranged in second and third areas AA2 and AA3, and FIG. 12B is a circuit diagram illustrating an anode initialization voltage applied to light-emitting elements LD2-1, LD2-2, and LD2-3 arranged in a first area AA1.

Referring to FIGS. 12A and 12B, first electrodes AE (refer to FIG. 5) included in the light-emitting elements LD1-1, LD1-2, and LD1-3 arranged in the second and third areas AA2 and AA3 and first electrodes AE (refer to FIG. 5) included in the light-emitting elements LD2-1, LD2-2, and LD2-3 arranged in the first area AA1 may receive different anode initialization voltages from each other.

Referring to FIG. 12A, first electrodes AE respectively included in the a first-first light-emitting element LD1-1 emitting a light with a first color R, a first-second light-emitting element LD1-2 emitting a light with a second color G different from the first color R, and a first-third light-emitting element LD1-3 emitting a light with a third color B different from the first and second colors R and G may respectively receive anode initialization voltages Var_R, Var_G, and Var_B different from each other. Each of the first-first, first-second, and first-third light-emitting elements LD1-1, LD1-2, and LD1-3 may be provided in plural. The first-first, first-second, and first-third light-emitting elements LD1-1, LD1-2, and LD1-3 may be arranged in second and third areas AA2 and AA3.

Referring to FIG. 12B, first electrodes respectively included in a second-first light-emitting element LD2-1 emitting a light with a first color R, a second-second light-emitting element LD2-2 emitting a light with a second color G different from the first color R, and a second-third light-emitting element LD2-3 emitting a light with a third color B different from the first and second colors R and G may respectively receive anode initialization voltages Var_POD_R, Var_ POD_G, and Var_ POD_B different from each other. Each of the second-first, second-second, and second-third light-emitting elements LD2-1, LD2-2, and LD2-3 may be provided in plural. The second-first, second-second, and second-third light-emitting elements LD2-1, LD2-2, and LD2-3 may be arranged in a first area AA1.

As described above, the connection line (refer to CL of FIG. 5) disposed closer to the second area AA2 may have a relatively large length compared to the length of the connection line (refer to CL of FIG. 5) disposed farther away from the second area AA2. As the area of the connection line CL increases, the capacitance value (hereinafter, also referred to as the anode capacitance) between the connection line CL and the first electrode of the light-emitting element connected (or next (adjacent)) to the connection line CL may increase. That is, the anode capacitance of each of the light-emitting elements may increase along the first direction DR1. The anode capacitance of each of the light-emitting elements arranged in the second and third areas AA2 and AA3 may be greater than the anode capacitance of each of the light-emitting elements arranged in the first area AA1.

As the light-emitting elements have different anode capacitance values from each other, when the same anode initialization voltage is applied to the light-emitting elements, there may be differences in the amount of charge that is initialized, and slight variation may occur in the capacitance value of the light-emitting elements. Accordingly, luminance difference may occur among the light-emitting elements, and this may cause a decrease in the reliability of the electronic device. As the anode initialization voltage with a value corresponding to the different anode capacitance value of each light-emitting element is applied to each light-emitting element, the amount of charge initialized in each light-emitting element may be controlled, thereby maintaining a uniform overall charge state.

Similarly, by applying the anode initialization voltage with a different value to each light-emitting element that emits light of a different color, slight variation in the capacitance value of the light-emitting elements may be compensated for.

Although the embodiments of the disclosure have been described, it is understood that the disclosure should not be limited to these embodiments but various changes and modifications may be made by one ordinary skilled in the art within the spirit and scope of the disclosure as hereinafter claimed. Therefore, the disclosed subject matter should not be limited to any single embodiment described herein, and the scope of the inventive concept shall be determined according to the attached claims.

What is claimed is:

1. An electronic device comprising:

a base layer comprising a first area, a second area spaced apart from the first area in a first direction, and a third area defined between the first area and the second area;

pixel drivers each comprising pixel transistors;

a driving circuit which is spaced apart from the first area, disposed in the second area, and applies an electrical signal to each of the pixel drivers;

a first group of light-emitting elements arranged in the second area and the third area, each comprising a first electrode connected to a first group of a pixel driver among the pixel drivers, a second electrode disposed on the first electrode, and a light-emitting layer disposed between the first electrode and the second electrode;

a second group of light-emitting elements arranged in the first area, each comprising a first electrode connected to a second group of a pixel driver among the pixel drivers, a second electrode disposed on the first electrode, and a light-emitting layer disposed between the first electrode and the second electrode;

connection lines connecting the first and second groups of the light-emitting elements and the first and second group of the pixel drivers, respectively;

a first conductive layer comprising a plurality of first conductive patterns each of which receives a first constant voltage; and a second conductive layer comprising a plurality of second conductive patterns, each of which receives a second constant voltage and disposed on the plurality of first conductive patterns, wherein the connection lines are disposed between the first conductive layer and the second conductive layer, and capacitances between the connection lines and the first electrodes next to the connection lines are uniform in the first direction.

2. The electronic device of claim 1, wherein the first group of the pixel driver is disposed in the third area, and the second group of the pixel driver is disposed in the first area.

3. The electronic device of claim 2, wherein each of the second group of the light-emitting elements overlaps the second group of the pixel driver.

4. The electronic device of claim 1, wherein the plurality of first conductive patterns and the plurality of second conductive patterns overlap the connection lines in a plan view.

5. The electronic device of claim 1, wherein each of the first and second groups of the light-emitting elements receives a first driving voltage, a second driving voltage, a first initialization voltage, and a second initialization voltage, and each of the first constant voltage and the second constant voltage is one of the first driving voltage, the second driving voltage, the first initialization voltage, and the second initialization voltage.

6. The electronic device of claim 5, wherein the first constant voltage is equal to the second constant voltage.

7. The electronic device of claim 6, further comprising a plurality of contact portions respectively connecting the plurality of first conductive patterns and the plurality of second conductive patterns through at least one insulating layer.

8. The electronic device of claim 5, wherein the first constant voltage is different from the second constant voltage.

9. The electronic device of claim 1, wherein the connection lines arranged in the second and third areas among the connection lines have a width smaller than a width of the connection lines arranged in the first area among the connection lines in a plan view.

10. The electronic device of claim 1, wherein each of the connection lines arranged in the third area and next to the first area among the connection lines comprises a curved portion in a plan view.

11. The electronic device of claim 1, wherein a width of an active layer of a pixel transistor disposed in the third area among the pixel transistors is greater than a width of an active layer of a pixel transistor disposed in the first area among the pixel transistors in a cross-section.

12. The electronic device of claim 1, wherein the first electrodes respectively included in the first group of the light-emitting elements receive a different anode initialization voltage from the first electrodes respectively included in the second group of the light-emitting elements.

13. The electronic device of claim 12, wherein each of the first group of the light-emitting elements comprises a first-first light-emitting element which emits a light with a first color, a first-second light-emitting element which emits a light with a second color different from the first color, and a first-third light-emitting element which emits a light with a third color different from the first and second colors, each of the second group of the light-emitting elements comprises a second-first light-emitting element which emits a light with the first color, a second-second light-emitting element which emits a light with the second color different from the first color, and a second-third light-emitting element which emits a light with the third color different from the first and second colors, the first-first, first-second, and first-third light-emitting elements receive different anode initialization voltages, and the second-first, second-second, and second-third light-emitting elements receive different anode initialization voltages.

14. An electronic device comprising:

a base layer comprising a first area, a second area spaced apart from the first area in a first direction, and a third area defined between the first area and the second area;

pixel drivers each comprising pixel transistors;

a driving circuit which is spaced apart from the first area, disposed in the second area, and applies an electrical signal to each of the pixel drivers;

a first group of light-emitting elements arranged in the second area and the third area, each being connected to a first group of a pixel driver comprising a first pixel transistor among the pixel drivers;

a second group of light-emitting elements arranged in the first area, each being connected to a second group of a pixel driver comprising a second pixel transistor among the pixel drivers;

connection lines connecting the first and second groups of the light-emitting elements and the first and second group of the pixel drivers, respectively;

a first conductive layer comprising a plurality of first conductive patterns each of which receives a first constant voltage; and a second conductive layer comprising a plurality of second conductive patterns, each of which receives a second constant voltage and disposed on the plurality of first conductive patterns, wherein the connection lines are disposed between the first conductive layer and the second conductive layer, and an active layer of the first pixel transistor has a width greater than a width of an active layer of the second pixel transistor in a cross-section.

15. The electronic device of claim 14, wherein the plurality of first conductive patterns and the plurality of second conductive patterns overlap the connection lines in a plan view.

16. The electronic device of claim 14, wherein the connection lines arranged in the second and third areas among the connection lines have a width smaller than a width of the connection lines arranged in the first area among the connection lines in a plan view.

17. The electronic device of claim 14, wherein each of the first and second groups of the light-emitting elements receives a first driving voltage, a second driving voltage, a first initialization voltage, and a second initialization voltage, and each of the first constant voltage and the second constant voltage is one of the first driving voltage, the second driving voltage, the first initialization voltage, and the second initialization voltage.

18. The electronic device of claim 17, wherein the first constant voltage is equal to the second constant voltage.

19. The electronic device of claim 17, wherein the first constant voltage is different from the second constant voltage.

20. The electronic device of claim 14, wherein first electrodes respectively included in the first and second groups of the light-emitting elements receive different anode initialization voltages.

* * * * *